United States Patent
Annino et al.

(10) Patent No.: US 9,448,290 B2
(45) Date of Patent: Sep. 20, 2016

(54) MAGNETIC RESONANCE HYPERPOLARIZATION AND MULTIPLE IRRADIATION PROBE HEAD

(75) Inventors: Giuseppe Annino, Sesto Fiorentino (IT); Alessandro Macor, Villars Sous Yens (CH); Emile De Rijk, Lausanne (CH); Stefano Alberti, Preverenges (CH)

(73) Assignee: CONSIGLIO NAZIONALE DELLE RICERCHE, Rome (IT)

( * ) Notice: Subject to any disclaimer, the term of this patent is extended or adjusted under 35 U.S.C. 154(b) by 486 days.

(21) Appl. No.: 14/128,312

(22) PCT Filed: Jun. 27, 2012

(86) PCT No.: PCT/EP2012/062492
§ 371 (c)(1),
(2), (4) Date: Dec. 20, 2013

(87) PCT Pub. No.: WO2013/000964
PCT Pub. Date: Jan. 3, 2013

(65) Prior Publication Data
US 2014/0117988 A1    May 1, 2014

(30) Foreign Application Priority Data

Jun. 28, 2011    (WO) .................. PCT/EP2011/060856

(51) Int. Cl.
*G01R 33/28*      (2006.01)
*G01R 33/345*     (2006.01)
*G01R 33/62*      (2006.01)
*G01R 33/20*      (2006.01)
*G01R 33/30*      (2006.01)

(52) U.S. Cl.
CPC ............. *G01R 33/282* (2013.01); *G01R 33/20* (2013.01); *G01R 33/3456* (2013.01); *G01R 33/62* (2013.01); *G01R 33/302* (2013.01)

(58) Field of Classification Search
CPC  G01R 33/282; G01R 33/20; G01R 33/3456; G01R 33/62; G01R 33/302
See application file for complete search history.

(56) References Cited

U.S. PATENT DOCUMENTS

2011/0050225 A1    3/2011  Prisner et al.
2012/0068706 A1    3/2012  Prisner et al.

FOREIGN PATENT DOCUMENTS

WO    2010112137 A1    10/2010

*Primary Examiner* — David Gray
*Assistant Examiner* — Laura Roth
(74) *Attorney, Agent, or Firm* — Volpe and Koenig, P.C.

(57) ABSTRACT

A hyperpolarization and multiple irradiation probe head, suitable for use in connection with magnetic resonance techniques (DNP-NMR, photo-DNP-NMR, ENDOR-EPR, MRI, DNP-MRI), comprising a RF transducer for generating and detecting a RF signal, wherein said RF transducer has a conducting element (2) allowing, together with at least one fully or partially connected grid polarizer made of conducting grid elements (1) which are reciprocally spaced so as the grid is at least partially transparent to a given microwave beam (3), controlled RF current paths and a substantially uniform RF magnetic field inside the RF transducer, wherein the grid polarizer (1) and the conducting element (2) forming the RF transducer are shaped and oriented to conform to said microwave beam phase fronts, said grid polarizer and said conducting element surrounding a sample (8), which is apt to be irradiated also by said microwaves (3); the probe head being also suited for a simultaneous irradiation of the sample with THz, FIR, IR, visible, and UV electromagnetic radiation.

21 Claims, 18 Drawing Sheets

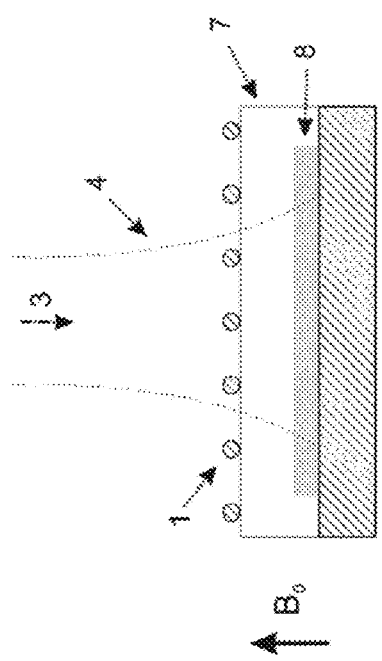
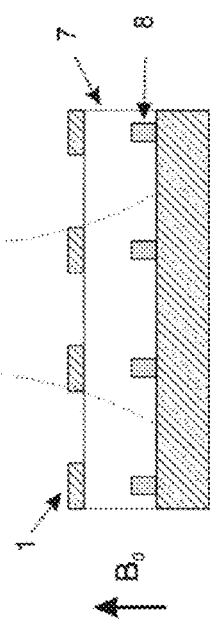
Fig. 2A
Fig. 2B

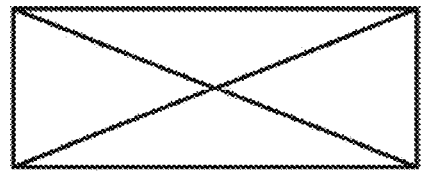
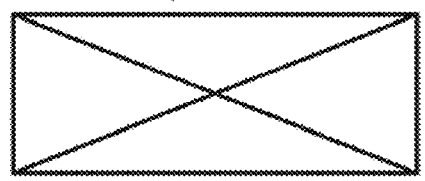
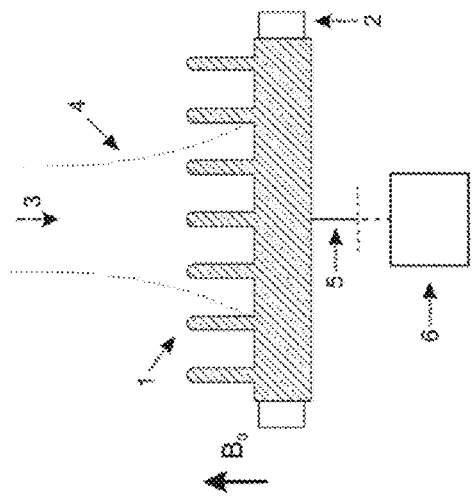
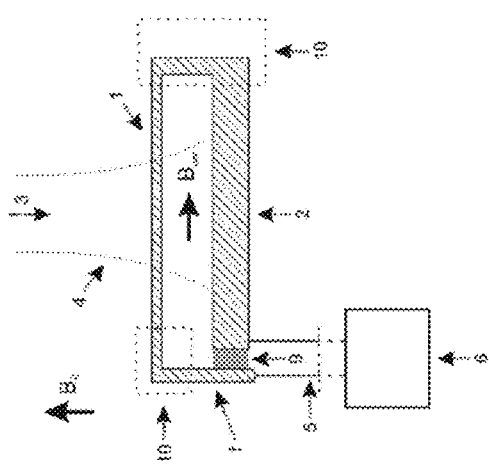
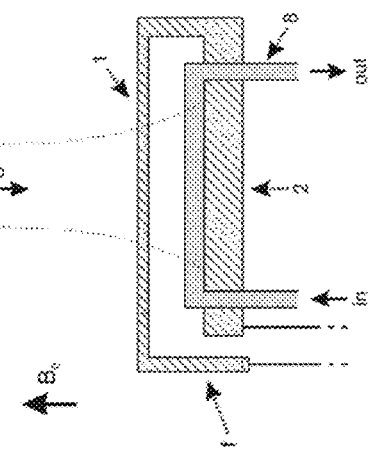
Fig. 5A  Fig. 5B  Fig. 5C  Fig. 5D

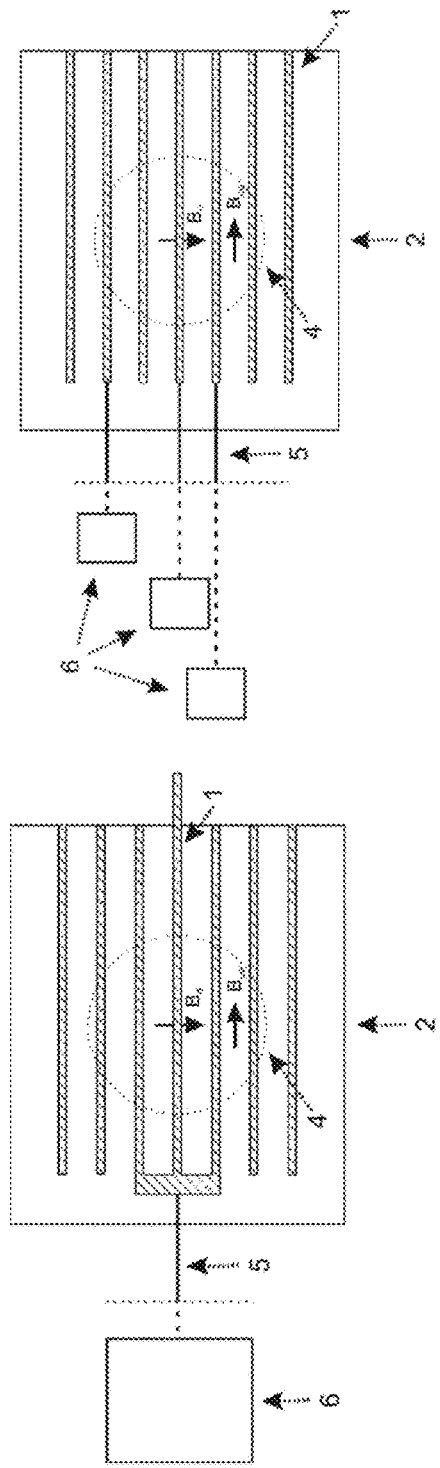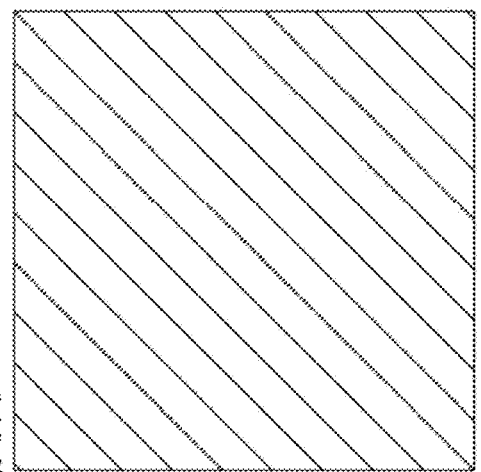
Fig. 7A
Fig. 7B
Fig. 8

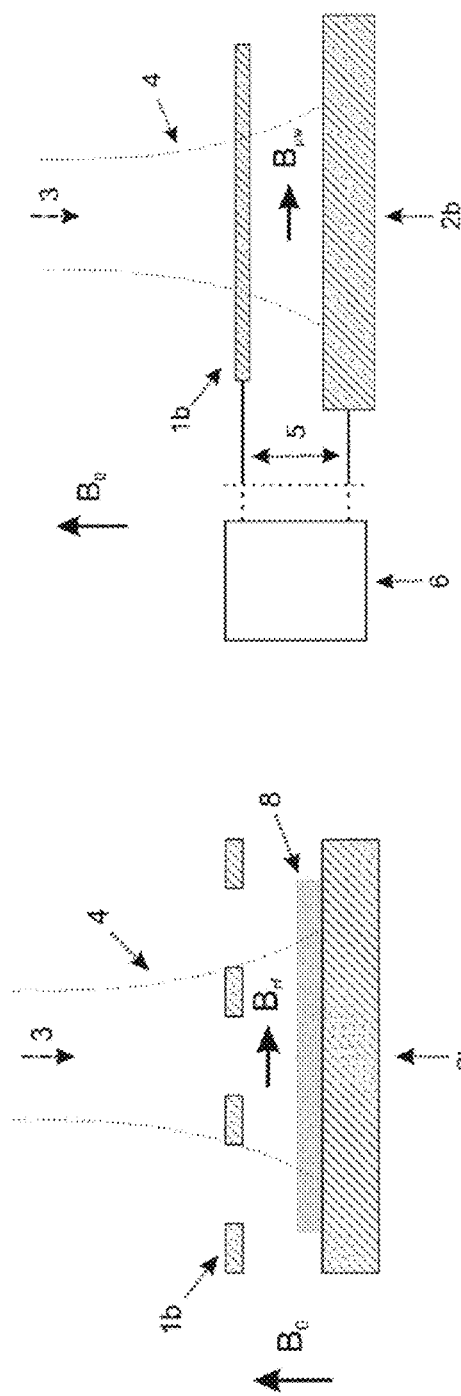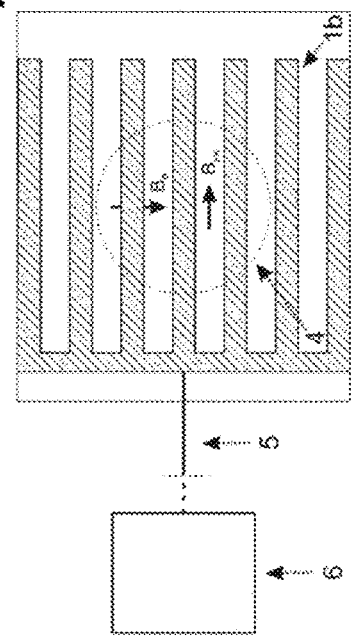
Fig. 9A  Fig. 9B  Fig. 9C

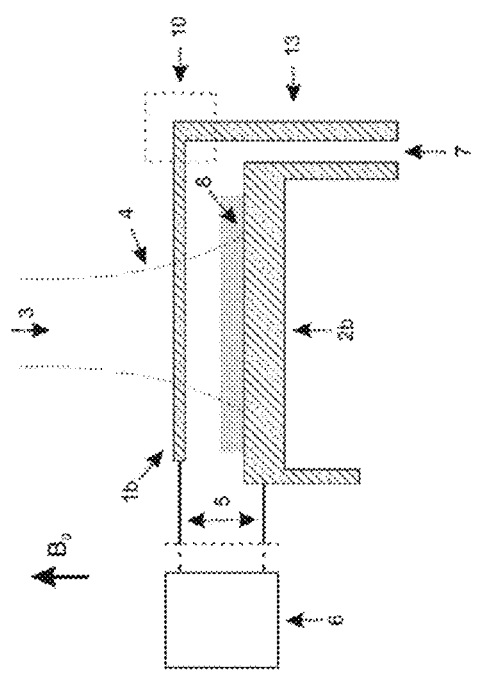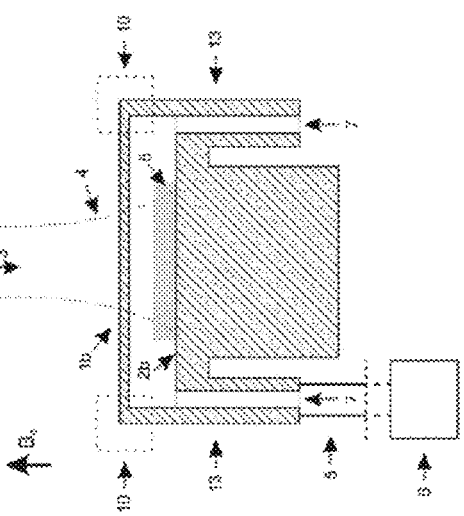

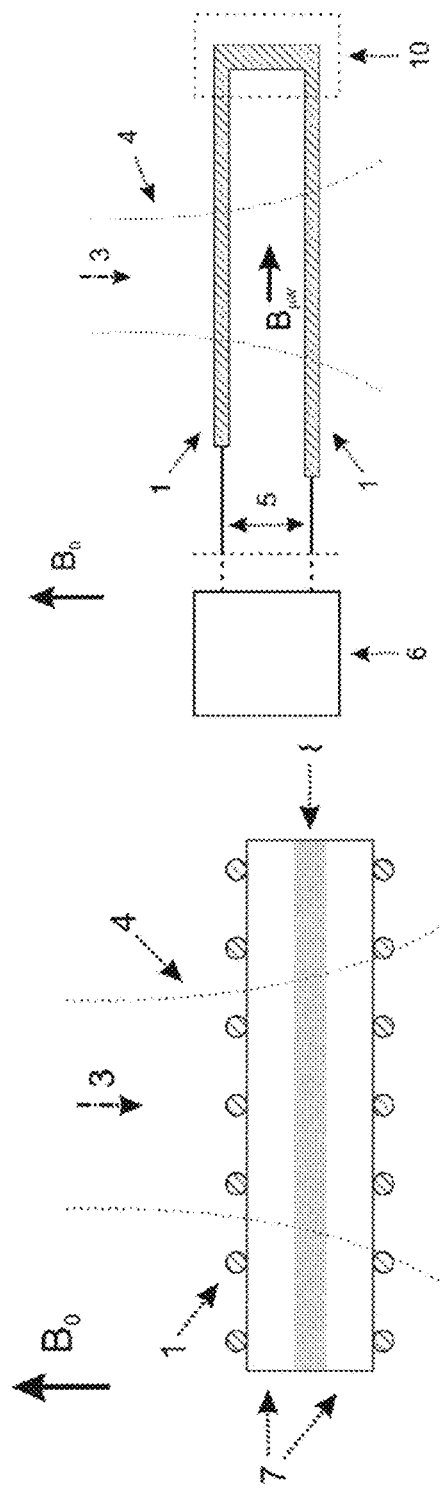
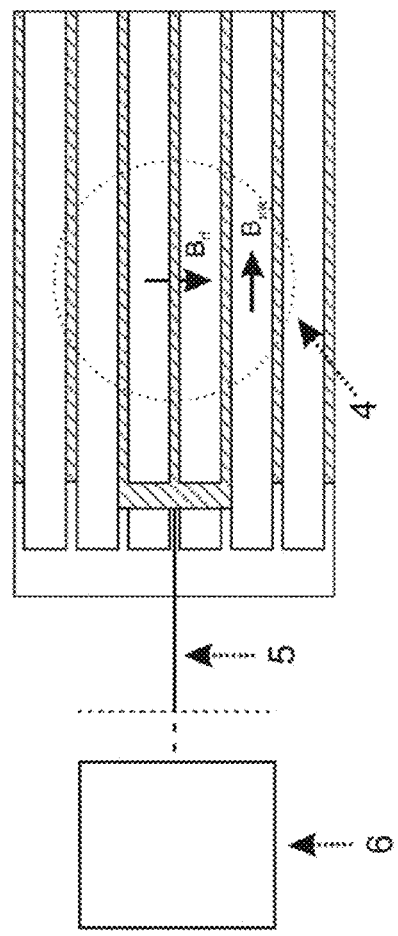

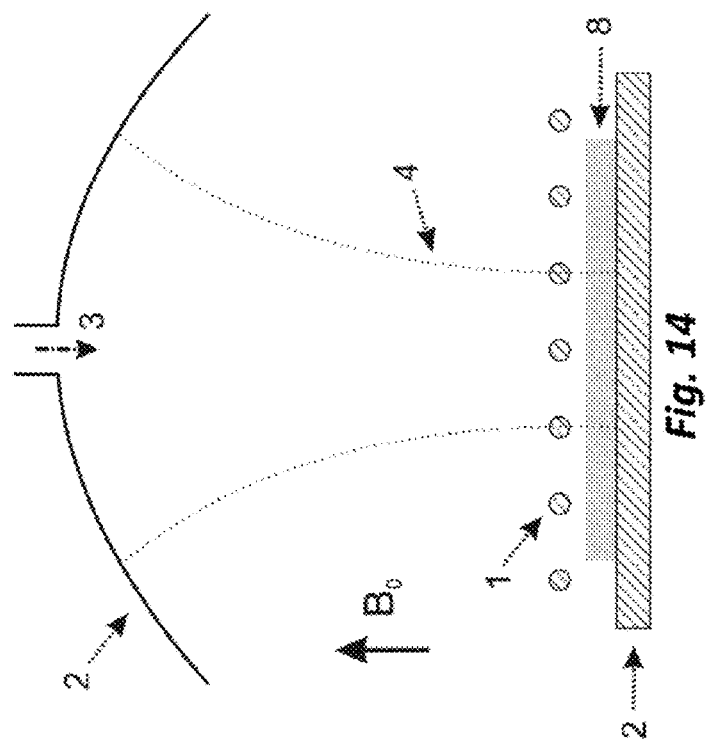
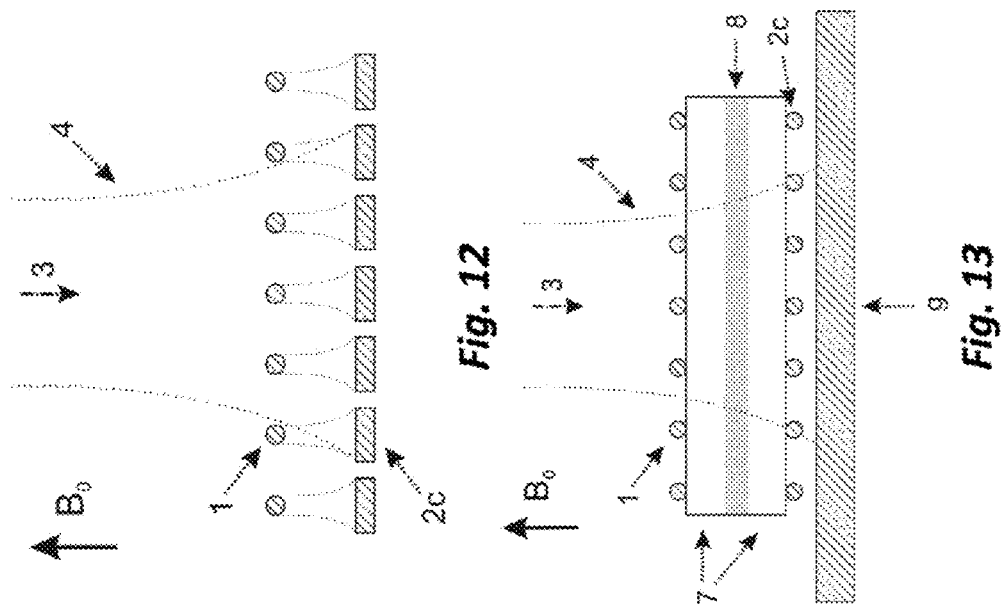
Fig. 12
Fig. 13
Fig. 14

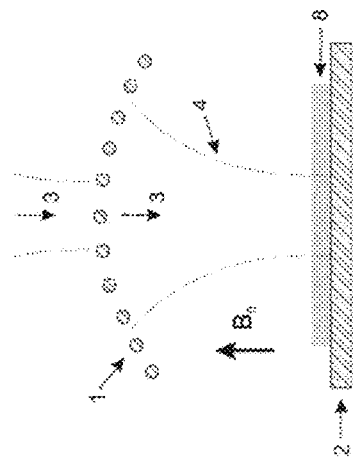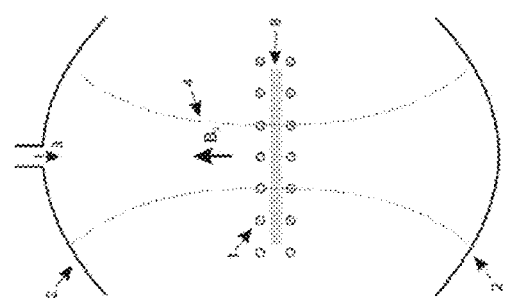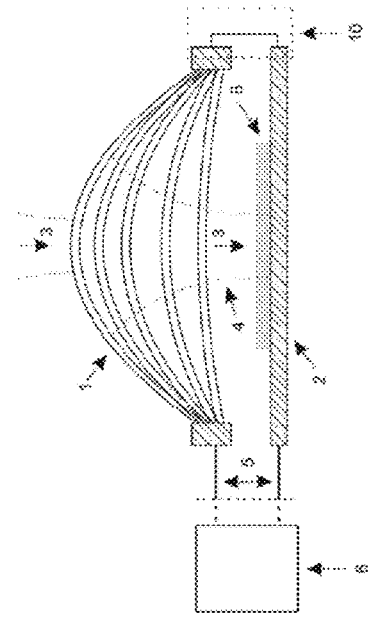

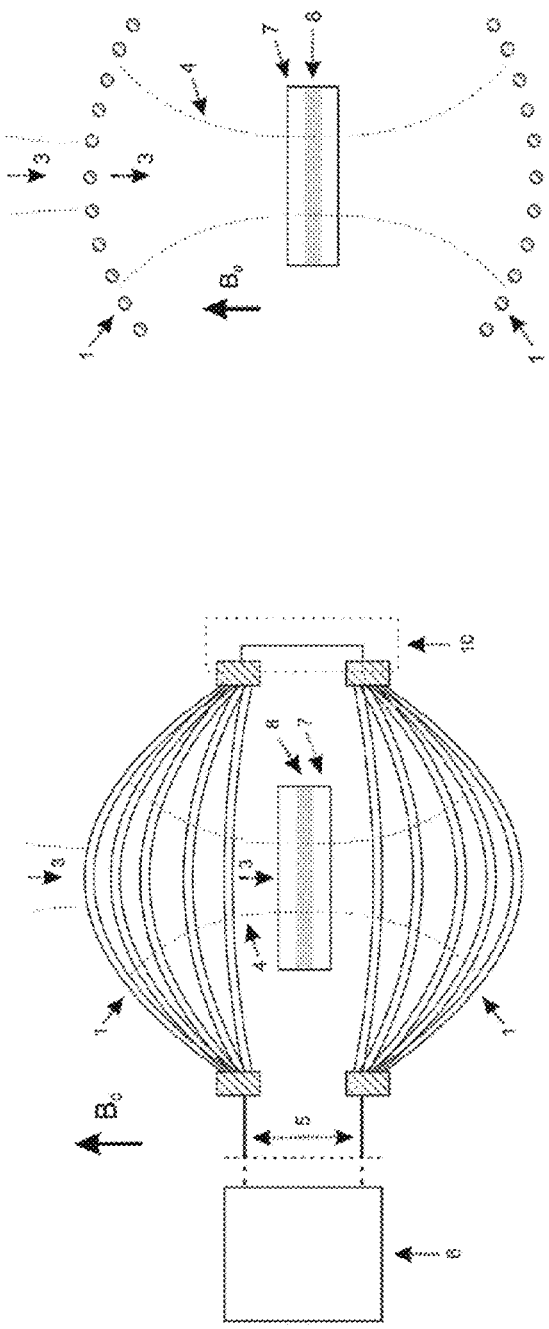
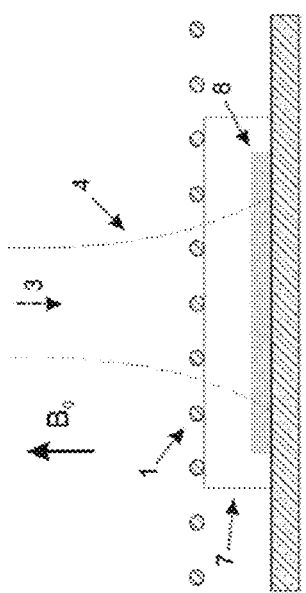
Fig. 17A
Fig. 17B
Fig. 18

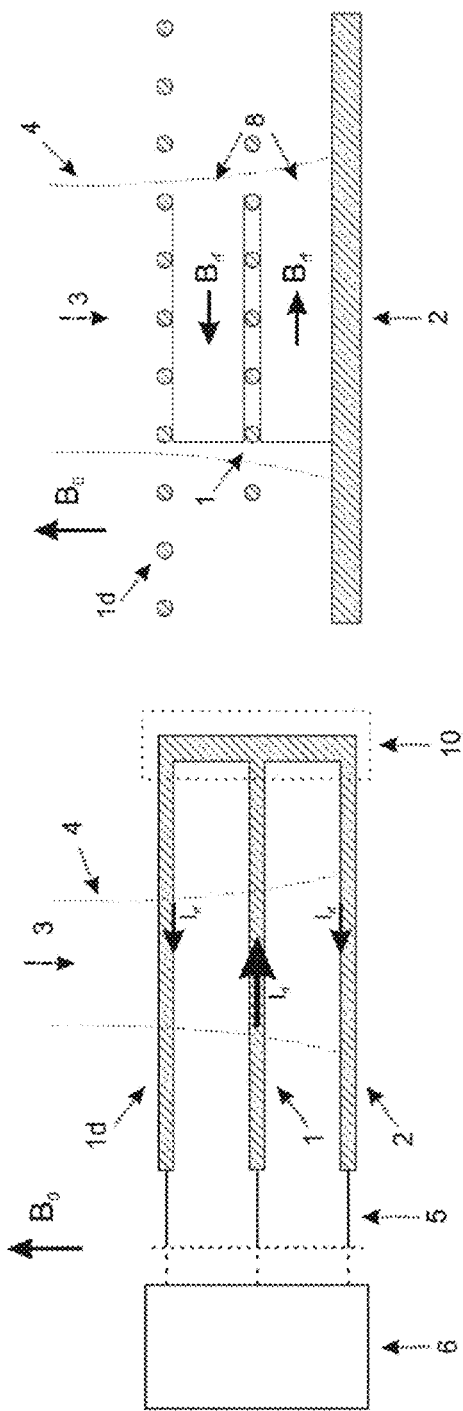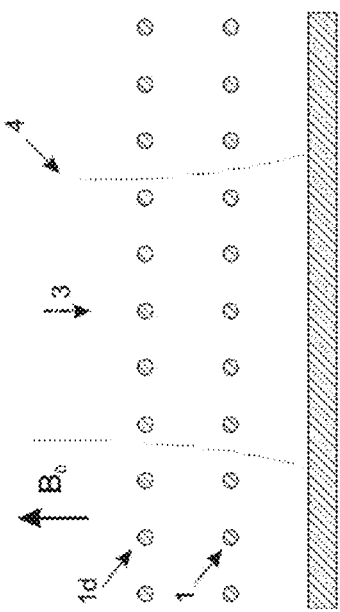

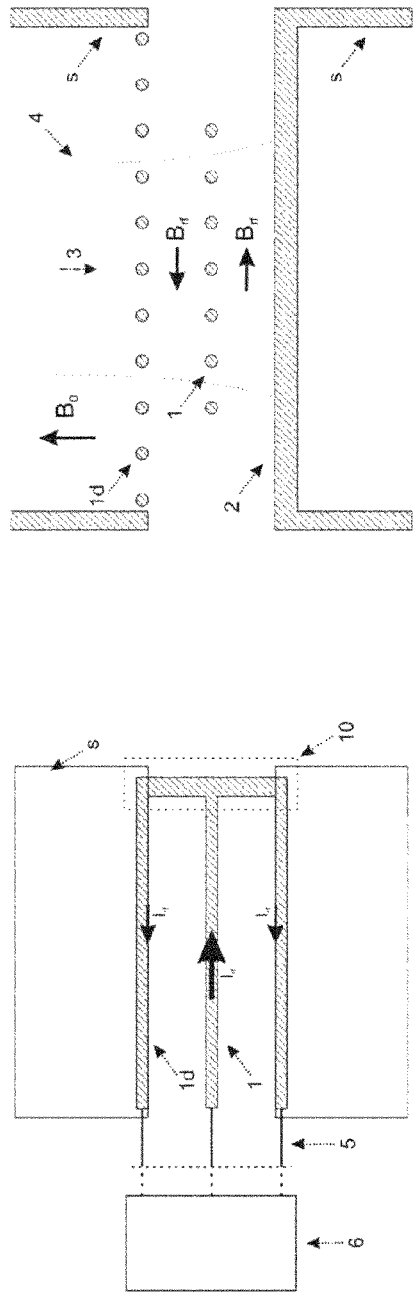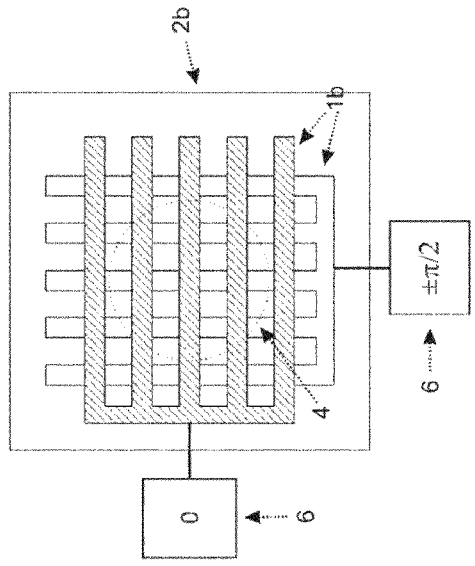
*Fig. 21A*
*Fig. 21B*
*Fig. 22*

MAGNETIC RESONANCE HYPERPOLARIZATION AND MULTIPLE IRRADIATION PROBE HEAD

BACKGROUND OF THE INVENTION

1. Field of the Invention

The present invention is related to a probe head for hyperpolarization and in general for multiple electromagnetic irradiation of a sample, the probe head acting as radiofrequency (RF) signal transducer, i.e. transducer intended both for generating a RF electromagnetic field suitable for the analysis of the sample by means of Nuclear Magnetic Resonance (NMR) spectroscopy, Magnetic Resonance Imaging (MRI) techniques, and Electron-Nuclear Double Resonance (ENDOR) technique in Electron Paramagnetic Resonance (EPR), the latter also known as Electron Spin Resonance (ESR), as well as for detecting a RF field signal generated by the sample in a way suitable for NMR and MRI techniques, the probe head also allowing a simultaneous, controlled, and efficient irradiation of the sample by microwaves (MW or $\mu$N) and higher frequency waves.

With the term hyperpolarization it is intended a kind of nuclear spin polarization of a material beyond the thermal equilibrium thereof. Known techniques of hyperpolarization are the Dynamic Nuclear Polarization (DNP), the Chemically Induced Dynamic Nuclear Polarization (CIDNP), the photo-CIDNP, to be used in the field of magnetic resonance techniques like NMR and MRI. The hyperpolarization techniques can enhance the sensitivity of the NMR and MRI measurements by orders of magnitude, opening the NMR and the MRI to unprecedented applications. Another example of multiple irradiation techniques in magnetic resonance is the ENDOR technique in EPR. In all the above techniques, the samples usually contain stable, chemically induced, or photo-generated paramagnetic species, as triplet states.

2. Description of the Prior Art

The NMR, MRI, and EPR techniques, developed since the middle of the last century, have had a huge impact thanks to their diagnostic capabilities in health analysis and to their ability to reveal the conformational details of complex bio-molecules like proteins.

A common trend in NMR, MRI, and EPR is the improvement in sensitivity and spectral resolution. In addition to magnetic resonance spectrometers working at higher and higher magnetic fields, in NMR and MRI several new probe heads have been developed, also in connection with hyperpolarization techniques as DNP. Analogously, in the field of EPR continuous efforts have been devoted to the development of efficient probe heads for multiple irradiation techniques as ENDOR. In this connection, different RF transducers have been proposed.

In particular, such RF transducers have been disclosed with the shape of solenoid coils or microcoils, in which the sample is accommodated inside the solenoid, as discussed for instance in (Webb, Progress in Nuclear Magnetic Resonance Spectroscopy vol. 31, 1-42 (1997)). However, as proposed so far, the solenoid is not suited for a controlled MW irradiation of the sample at high power, due to the distortion induced on the MW field in the sample region, which can generate a relevant dielectric heating of the sample. Moreover, it is not suited for large planar samples, which can be studied only increasing the size, thus sacrificing the RF sensitivity.

Then, a flat helical RF coil has been proposed in which the sample is placed on the device. It has a relatively poor RF field homogeneity, as discussed for instance in (Kentgens et al., The Journal of Chemical Physics vol. 128, 052202 (2008)). Moreover, it is not suited for a controlled MW irradiation of the sample at high power, since also in this case a strong distortion in the MW field distribution is expected around the metallic stripes edges.

Moreover, RF transducers in the form of striplines have been disclosed. The presence of a double ground plane shielding the central conductor of the stripline and the adjacent regions in which the sample can be usefully placed, make them unsuited for a simple and efficient MW irradiation of the sample at high power.

Further, RF transducers in the form of microstrips have been proposed. In the most sensitive versions, the RF magnetic field generated by the RF transducer is very inhomogeneous, limiting the application to extremely minute samples.

The US patent application No. Publ. 2011/0050225 (Prisner et al.) discloses a probe head for DNP-NMR and ENDOR techniques wherein the RF transducer is a RF resonator in the form of a single strip, at the same time such strip forming a portion of a corresponding MW resonator. This probe head is suited for thin samples, where it shows, however, a relatively modest RF filling factor, which translates in a limited sensitivity. For thick samples, it suffers of scarce RF field homogeneity.

The further US patent application No. Publ. 2012/0068706 (Prisner et al.) discloses a probe head for DNP-NMR and ENDOR techniques wherein the RF transducer is composed by a plurality of conductive strips, preferably connected in series in order to increase the RF conversion factor, at the same time such strips forming a portion of a corresponding MW resonator. This probe head is suited again for thin samples, where it shows, however, a relatively modest RF filling factor, which translates in a limited sensitivity, analogously to the previous case. For thick samples, it suffers of scarce RF field homogeneity.

In conclusion, none of the above cited probe heads and related devices can solve the numerous issues that influence, often simultaneously, the efficiency of the hyperpolarization and multiple irradiation techniques in magnetic resonance, as the sensitivity of the measurement; the dielectric heating of the sample; the compatibility with complex microfluidic structures and with large planar samples; the homogeneity of the RF irradiation; the efficiency and the control of the MW irradiation and the susceptibility broadening.

SUMMARY OF THE INVENTION

The proposed probe head, as claimed in the annexed claim 1, is aimed to solve the problem of providing devices generating and detecting RF electromagnetic radiation efficiently, being also compatible with a simultaneous, controlled, uniform, and efficient irradiation with MW electromagnetic radiation of small and large samples, also at very high MW powers, in presence of static or quasi-static magnetic and electric fields, for those cases in which the success of the application is related to a controlled amplitude and distribution of the electromagnetic, static, and quasi-static fields on the sample.

Moreover, the proposed probe head may be suited for the further electromagnetic irradiation of the sample with shorter wavelengths, for instance in the Terahertz (THz), Far Infrared (FIR), Infrared (IR), visible, and ultraviolet (UV) part of the electromagnetic spectrum, and beyond.

The novelty of the idea behind the claimed probe head is to obtain a RF transducer for generating and detecting a RF signal by combining a conducting element, for instance a conducting plate, with conducting grid polarizers made of grid elements which are reciprocally spaced so as the grids are partially transparent to a given externally generated microwave beam, the two basic components of the RF transducer, namely the conducting element and the grid polarizers, being designed to allow controlled RF current paths surrounding the sample.

The invented structure leads to two main functionalities. The first one is to impose suitable boundary conditions on the high frequency electromagnetic waves generated by external sources, here defined as MW (down to few GHz) or higher frequency waves. In particular, the boundary conditions are designed to allow an efficient electromagnetic irradiation of the sample with a controlled electromagnetic field distribution, obtained shaping the conducting element and the grid polarizers according to the phase front of the microwave beam. The second functionality is to allow an efficient and controlled generation of low frequency electromagnetic fields in the region of the sample, here defined as RF (up to few GHz) or lower frequency signals, as well as an efficient detection of the low frequency electromagnetic fields generated by the sample.

The characteristics of the claimed invention are such that they solve or mitigate part of the problems evidenced by the magnetic resonance hyperpolarization or multiple irradiation probe heads known from the prior art. The features and the advantages of the claimed invention will become apparent from the following descriptions of several embodiments thereof, given to an exemplificative and non-limitative purpose.

BRIEF DESCRIPTION OF THE DRAWINGS

FIG. 2A is a front view which illustrates a possible accommodation of a planar sample in the probe head of FIG. 1A;

FIG. 2B is a front view which illustrates a possible accommodation of a sample in microfluidic channels in a probe head according to an alternative version of the probe head of FIG. 1A;

FIG. 5A is a side view of a probe head according to a fourth embodiment thereof, with almost closed current paths, wherein the conducting parts inside the dashed rectangular regions can be replaced by generic electric contacts;

FIG. 5B is a front view of the probe head of FIG. 5A;

FIG. 5C is a side view of the probe head of FIG. 5A, showing a possible insertion of the sample, which is particularly useful in the case of liquid samples;

FIG. 5D is a side view of a possible overall configuration of a measurement setup with the probe head of FIG. 5C inside a magnet;

FIG. 7A is a top view of a probe head according to a sixth embodiment thereof, allowing a selective RF excitation and detection;

FIG. 7B is a top view of a variant of the probe head of FIG. 7A, wherein it is provided a series of RF excitation and detection circuits, possibly operating at different RF frequencies, simultaneously or not simultaneously;

FIG. 8 is a top view (left) and a side view (right) of a probe head according to a seventh embodiment thereof, wherein a mirror part of the probe head is possibly corrugated;

FIG. 9A is a front view of a eighth embodiment of a probe head according to the invention, based on a microstrip design;

FIG. 9B is a side view of the probe head of FIG. 9A;

FIG. 9C is a top view of the probe head of FIG. 9A;

FIG. 10A is a side view of a first variant of the probe head of FIG. 9A, wherein the conducting parts inside the dashed rectangular region can be replaced by generic electric contacts;

FIG. 10B is a side view of a second variant of the probe head of FIG. 9A, wherein the conducting parts inside the dashed rectangular regions can be replaced by generic electric contacts;

FIG. 11A is a front view of a probe head according to a ninth embodiment thereof, which is almost completely transparent to the microwave radiation;

FIG. 11B is a side view of the probe head of FIG. 11A, wherein the conducting parts inside the dashed rectangular region can be replaced by generic electric contacts;

FIG. 11C is a top view of the probe head of FIG. 11A;

FIG. 12 is a front view of a probe head according to a tenth embodiment thereof, not provided with a separated physical mirror;

FIG. 13 is a front view of a variant of the probe head of FIG. 11A, provided with a separated physical mirror;

FIG. 14 is a front view of a probe head according to said first embodiment, integrated within a Fabry-Perot resonator;

FIG. 15 is a front view of a probe head according to said ninth embodiment, inserted within a Fabry-Perot resonator;

FIG. 16A is a front view of a probe head according to a twelfth embodiment thereof, wherein the probe head acts itself as a microwave resonator;

FIG. 16B is a side view of the probe head of FIG. 16A, wherein the conducting parts inside the dashed rectangular region can be replaced by generic electric contacts;

FIG. 16C is a front view of a modification of the probe head of FIG. 14, wherein the probe head is part of a FP resonator, possibly acting itself as a sub-resonating element;

FIG. 17A is a side view of a probe head according to a thirteenth embodiment thereof, wherein two grids act themselves as microwave resonator and wherein the conducting parts inside the dashed rectangular region can be replaced by generic electric contacts;

FIG. 17B is a front view of the probe head of FIG. 17A;

FIG. 18 is a front view of a probe head according to a fourteenth embodiment thereof, wherein the structure is planar and the probe head acts also as microwave resonator, where the lateral confinement of the microwave radiation is obtained by means of a dielectric region;

FIG. 19A is a side view of a probe head according to a fifteenth embodiment thereof, wherein the interaction between the radiofrequency magnetic energy of the probe head and a sample accommodated inside the probe head can be maximized. The conducting parts inside the dashed rectangular region can be replaced by generic electric contacts;

FIG. 19B is a front view of the probe head of FIG. 19A;

FIG. 20 is a front view of a variant of the probe head of FIG. 19A, wherein the extension of the central grid is comparable to that of the upper grid;

FIG. 21A is a side view of another variant of the probe head of FIG. 19A, wherein the RF magnetic field flux is forced to accumulate in the regions between a lower mirror, a central grid, and an upper grid, by means of conducting shields. The conducting parts inside the dashed rectangular region can be replaced by generic electric contacts;

FIG. 21B is a front view of the probe head of FIG. 21A;

FIG. 22 is a top view of a variant of the probe head of FIG. 9A, wherein the upper part of the probe head is composed by two orthogonal grids, instead of a single one;

DESCRIPTION OF THE PREFERRED EMBODIMENTS

Figure 1A:
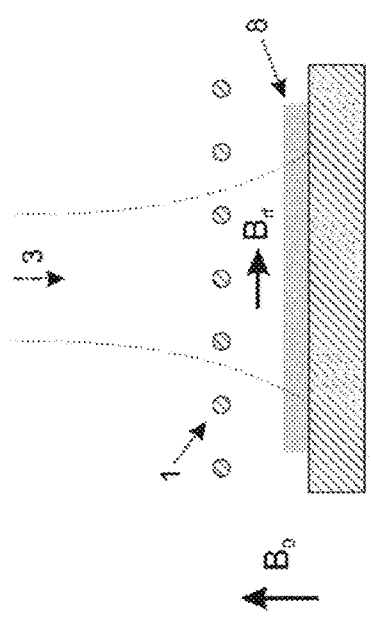
FIG. 1A is a front view of a basic structure of a first embodiment of probe head according to the present invention.

In the framework of the above mentioned magnetic resonance techniques, a sample placed in an external static magnetic field $B_0$ is irradiated with electromagnetic waves at frequencies typical of nuclear Zeeman transitions (NMR transitions, corresponding to RF excitation with frequencies up to few GHz) or with frequencies typical of electron Zeeman transitions (EPR transitions, corresponding to MW excitation with frequencies up to few THz). These two kinds of excitation are combined in the Dynamic Nuclear Polarization-like techniques, where said MW excitation is employed with the goal of saturating the electron spin transitions of the paramagnetic species or more generally to modify the related electron spin populations and coherences. The variation of the electron states affects the nuclear spins, whose state is revealed through the NMR techniques (DNP-NMR, DNP-MRI, etc.). A proper application of this double-excitation technique can introduce an enhancement in the NMR signal of orders of magnitude.

In the so-called dissolution DNP, the sample is frozen to very low temperatures, where it is polarized by means of a MW irradiation; it is then rapidly heated up to the temperature of interest for the NMR characterization and use.

Classical DNP methods require a high static magnetic field, often low temperatures, and stable paramagnetic centers, the latter shortening the relaxation time of the polarized protons. These constraints can be largely relaxed by replacing the permanent paramagnetic centers with chemically induced paramagnetic species or with short-lived photo-excited triplet states. In the latter case, the electrons in the triplet state do not follow the Boltzmann distribution and are naturally polarized to almost 90% due to the transition probabilities from the first excited state to the three levels in the triplet state. This open up the possibility to conduct (photo-)DNP at low magnetic field and room temperature and it also removes the need for fixed paramagnetic centers in the sample, extending the relaxation time of the polarized protons.

Otherwise, in the Electron-Nuclear Double Resonance (ENDOR) techniques, the RF excitation is used to saturate the nuclear spin transitions or in general to modify the populations and the coherences of the nuclear spin states, detecting the effects of these changes on the electron spin states of paramagnetic species (ENDOR-EPR), either stably present in the system, chemically induced, or photo-generated.

One of the primary aims of the probe heads hereinafter disclosed is to overcome several limitations evidenced by the devices proposed so far in the field of the DNP-NMR, of the DNP-MRI, and of the ENDOR-EPR, in particular the lack of a structure allowing a very efficient generation and detection of RF electromagnetic radiation with controlled field profile and polarization, being at the same time compatible with a simultaneous, controlled, uniform, and efficient irradiation with MW electromagnetic frequencies of small and distributed samples, also at very high MW power, in presence of weakly perturbed and well controlled static or quasi-static magnetic and electric fields, still allowing an efficient irradiation of the sample with higher frequency electromagnetic waves, as THz, FIR, IR, visible, and UV waves.

The proposed probe heads further provide technical solutions to increase the measurement sensitivity, for a better control of the RF field on the sample, to allow the miniaturization of the probe head, to make easier the in situ characterization of arrays of samples, to permit the RF and MW excitation and detection with circularly polarized fields, and to obtain the integration of resonant elements in a RF circuit and in a MW circuit as well.

The basic idea behind the claimed probe head is to obtain a RF transducer for generating and detecting a RF signal by combining two basic components, namely a conducting element, for instance a conducting plate, with conducting grid polarizers made of grid elements which are reciprocally spaced so as the grids are partially transparent to a given externally generated microwave beam. The two basic components of the RF transducer, namely the conducting element and the grid polarizers, are designed to obtain controlled and preferably parallel RF current paths surrounding the sample, in order to maximize and make homogeneous the RF magnetic field on said sample. Moreover, these components are preferably shaped to substantially conform and superpose to the phase fronts of the MW beam. In this manner, the part of the MW beam possibly reflected by the two basic components of the RF transducer substantially has a univocally defined phase with respect to the MW beam, which results in a controlled standing wave pattern for the MW radiation inside and around the probe head. Moreover, the use of components shaped similarly to the phase fronts of the MW beam allows to minimize the distortion of the MW beam profile, these distortions usually generating loss of MW energy through a spatial diffusion of the radiation.

In connection with FIGS. 1A to 1C a first probe head according to the present invention comprises a RF transducer composed by two main elements, namely a grid polarizer embodied by one grid made of conducting grid elements (1) and a conducting element (2) in form of plate, in the present embodiment electrically connected between them with a conducting component (c) and to a RF circuit (6) through conducting elements (5), which will be detailed in the following.

Therefore, herein conducting grid polarizer it is generally intended to be a grid, i.e. a framework or a mesh of conducting wires, strips, rods or bar-like elements, generally indicated as grid elements. In this embodiment, the grid polarizer is composed by parallel and mutually spaced grid elements, i.e. wires or strips (1), arranged according to a predetermined direction on a planar surface.

At a certain distance from the grid polarizer (1), a conducting element (2) is arranged, substantially parallel to or anyway facing said grid, whose function is first to obtain almost closed RF circuit paths, in this case with RF currents flowing substantially parallel and in opposite direction with respect to those flowing in the grid polarizer, as well as to provide a reflecting surface (mirror) for the MW beam (3), said mirror facing said grid polarizer.

The space enclosed between the conducting element (2) and the grid polarizer (1) is apt to receive a sample to be scanned by an NMR spectroscopy or the like, as above explained. The distance between the conducting element (2) and the grid polarizer (1) falls in the range between a fraction of micron (μm), in the case of an extremely miniaturized device, and several millimeters. The conducting element (2) provides the rest for the sample.

Both the main elements of the RF transducer, namely the grid polarizer (1) and the conducing element (2), are illuminated by a single-frequency or multi-frequency MW beam (3) coming from MW sources not represented in the drawings, said sources being not part of the probe head. The beam (3) is oriented according to a direction substantially perpendicular to the mirror surface (2) and grid planar surface (1), and it has a profile (4) substantially centered with respect to the grid polarizer, so as to define a sample area. In this embodiment, the phase fronts of said MW beam (3) are preferentially planar close to the probe head.

In the following, $B_{mw}$ and $E_{mw}$ designate the magnetic field and the electric field associated to said microwave beam, respectively.

According to the above described arrangement, the grid polarizer (1) is at least partially transparent to one polarization of said microwaves.

Moreover, it is noted that the direction of the external static magnetic field $B_0$, in this embodiment orthogonal to the probe, can be in general arbitrary. The propagation direction of the single-frequency or multi-frequency microwave beam, in this embodiment orthogonally oriented towards the probe, can be in general arbitrary, as well as the shape and polarization thereof. In the present embodiment, the magnetic field $B_{mw}$ of the microwave beam is parallel to the probe. The width of the microwave beam impact area may be even larger than the grid area.

The grid polarizer, i.e. each grid element (1), is electrically connected to the conducting element (2) by means of a conducting element (c) to obtain a RF transducer in the form of a substantially U-shaped distributed coil having two parallel sides surrounding the sample placed therein, these sides being given by the grid polarizer (1) and the conducting plate (2). The construction of a RF transducer which has substantially parallel sides carrying opposite RF currents, these sides surrounding moreover the sample, shows several benefits. The opposite RF currents in the substantially parallel sides allows to obtain intense and homogeneous RF magnetic fields inside the RF transducer, namely in the space between these sides, where the sample is preferably accommodated. The surrounding of the sample by means of the RF transducer allows to obtain high RF magnetic field filling factors for the sample. All the above characteristics translate in a high magnetic resonance sensitivity and efficiency.

Both the conducting element (2) and the grid elements (1) are further electrically connected via electrical connections (5) to a number of RF elements as generator and detector, to implement a generic radiofrequency circuit (6) apt to either generate a single-frequency or multi-frequency RF signal or to detect a single-frequency or multi-frequency RF signal.

It is noted that the shape of the MW beam profile (4) can be arbitrary; the wires or strips (1) can have variable shapes, sizes, lengths, radius of curvature, and cross sections (circular, rectangular, square, triangular and so on), the latter being preferably smaller than $\lambda_{mw}$, where $\lambda_{mw}$ is the MW wavelength in vacuum.

The mutual distance between adjacent grid elements (1) can change locally (point-by-point), and both the conducting element (2) and the conducting grid elements (1) can be made of any suitable conductive material, or combining insulating and conducting materials, the latter allowing the propagation of the RF currents, for instance by means of electroless plating (ELP) techniques, possibly combined with stereolithography. Other superconducting or non-conducting materials can be used as well in the construction of said elements (1) and (2), for instance in case of susceptibility-compensated devices.

In this embodiment of probe head according to the invention, the upper grid (1), the lower mirror (2), and the electrical connection (c) are obtained from a single, monolithic conducting block. In a further embodiment, some or all elements of the RF transducer are constructed combining insulating and conducting materials, for instance by means of deposition and coating techniques.

Figure 1C:
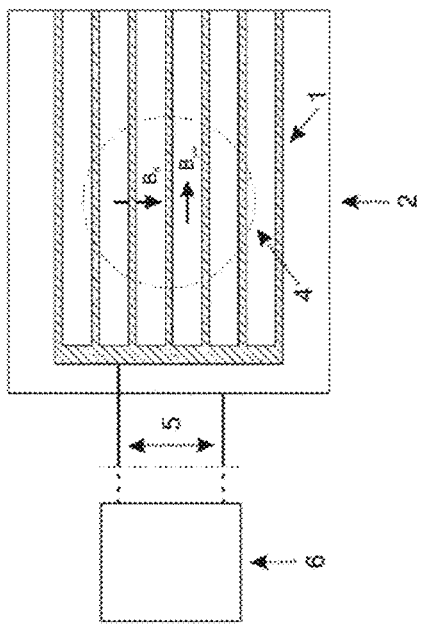
FIG. 1C is a top view of the probe head of FIG. 1A.
Figure 1B:
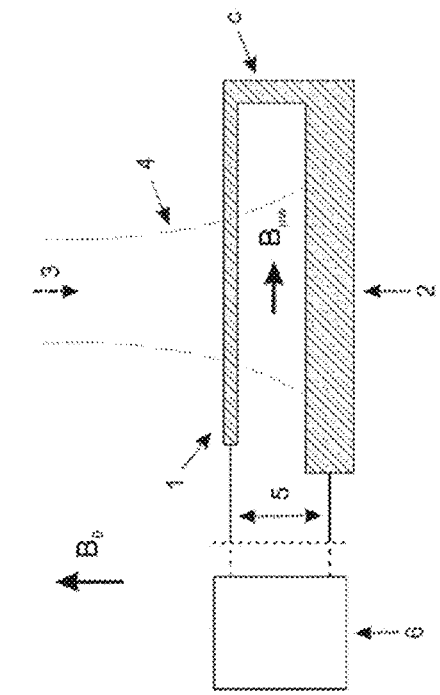
FIG. 1B is a side view of the probe head of FIG. 1A.
Figure 1D:
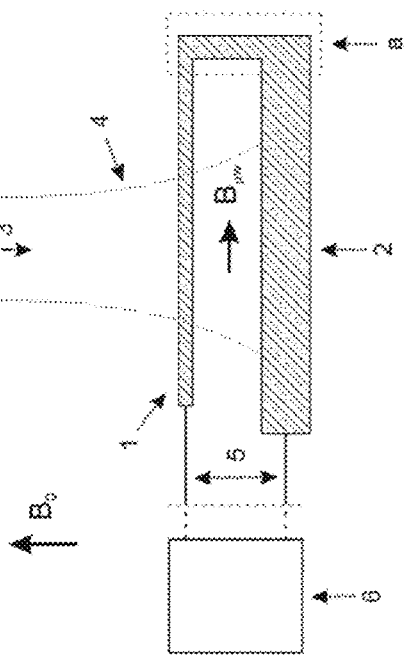
FIG. 1D is a side view of a basic structure of a first embodiment of probe head of FIG. 1A, wherein conducting parts (as that in the dashed rectangular region) can be replaced by generic electric contacts.

With reference to FIG. 1D, a variant of this embodiment is shown wherein the conducting parts inside the rectangular region indicated by "a" are replaced by generic electric contacts.

The above described combination of structures, namely the conducting element (2), the grid polarizer (1), and the electric connection (c), when properly designed allow the achievement of a high performance RF transducer, characterized by an intense and homogeneous RF magnetic field in its internal region. From the MW point of view, the grid polarizer (1) behaves as a substantially transparent element for the MW radiation with correct polarization, which moreover generates only a very localized MW electromagnetic field perturbation on MW beams with this polarization, when properly designed. The conducting element (2) behaves as a planar mirror for the MW radiation, which generates a standing wave pattern for the microwaves, in which the nodal points of the electric field $E_{mw}$ are superposed to the maxima of the magnetic field $B_{mw}$ and vice versa, provided that the microwave beam is properly polarized and characterized by substantially planar phase fronts, namely phase fronts with shape corresponding to that of the probe head elements (1) and (2) and almost superposed to them. The planar mirror (2) corresponds to a maximum of the $B_{mw}$ field and a nodal surface of the $E_{mw}$ field. In these conditions, the sample region inside the RF transducer can be irradiated by microwaves in a controlled and predictable way (standing wave pattern, MW electric and magnetic field separation, null MW electric field on the conducting element (2)), in an efficient way (almost complete transparency to MW of the grid polarizer (1)), simultaneously to an efficient RF excitation and detection of the sample, whereas the claimed uniformity of the MW irradiation of the sample can be obtained employing suited MW beams with cross section large with respect to the sample size.

The proposed embodiment, illustrated by FIG. 1, differs from those known from the prior art. In particular, it differs from the probe head disclosed in the US patent application No. Publ. 2011/0050225 (Prisner et al.), where the RF transducer is given by a single planar element (a RF stripline resonator or microstrip resonator, possibly slotted to form a multistrip planar element), connected to the RF circuit on one end and to the ground potential on the other end. In the RF transducer disclosed in the US patent application No. Publ. 2011/0050225, the RF currents are well controlled in the planar strip element, while they are essentially uncontrolled when reaching the ground potential, both directly (FIG. 8 and claim 37 of the US patent application 2011/0050225) or through a housing (FIGS. 1 to 4 and claim 46 of the US patent application 2011/0050225). On the contrary, the probe head here proposed is always composed by at least two elements surrounding the sample, namely the grid polarizer (1) and the conducting element (2), whose combination allows well controlled and almost closed RF current paths around the sample. As effect of these differences, the innovative probe head here proposed allows higher RF magnetic fields with respect to the probe head discussed in the US patent application 2011/0050225, since the RF currents flow two times close to the sample, one time in the grid polarizer elements (1) and one time in the conducting element (2), with relative directions such that their magnetic fields superpose and reinforce, neglecting the effects of the conducting element (c). In particular, approximately 2 times higher RF magnetic fields are expected for a similar total RF current in the RF transducer. Moreover, the combination of the RF currents in the two basic elements (1) and (2) of the invented RF transducer allows more homogeneous RF magnetic field distributions in the space between said elements (1) and (2), when compared to the probe head disclosed in the US patent application 2011/0050225. As a result of the inventive design of the probe head here proposed, the RF transducer behaves as an element which is 'closed' with respect to the RF field, in the sense that such field is well confined in the space comprised between the conducting mirror (2) and the grid polarizer (1), where the sample is accommodated, whereas in the probe head of the US patent application 2011/0050225 it is distributed all around the strip, up to the housing (FIG. 2 of the US patent application 2011/0050225), with a resulting low RF magnetic field filling factor for the probe head of the US patent application 2011/0050225. At the same time, the use of a grid polarizer (1), which can be designed to be almost completely transparent to microwaves, contrarily to the case of the US patent application 2011/0050225, where it must necessarily be a strongly reflecting element for the microwaves, makes the proposed probe head 'open' with respect to the MW irradiation of its internal space, where the sample is accommodated.

Analogously, the probe head here proposed is innovative with respect to the probe head disclosed in the US patent application No. Publ. 2012/0068706, wherein the RF transducer is again composed by a single RF element, comprising a plurality of conductive strips preferably connected in series among them, which is connected to the RF circuit on one end and to the ground potential on the other end, directly (FIGS. 1 to 3 and claims 36 to 37 of the US patent application 2012/0068706) or through a housing (claim 50 of the US patent application 2012/0068706), whereas the probe heads here proposed are always composed by at least two conducting elements which surround the sample, namely the grid polarizer (1) and the conducting element (2), whose combination allows well controlled and almost closed RF current paths around the sample. Thus, the same differences related to the use of a double element (1) and (2) in the proposed probe head apply, with the above illustrated benefits in terms of RF magnetic field filling factor and homogeneity.

The RF and MW capabilities of the present embodiment, which are to a large extent common to all the following embodiments, are confirmed by finite-element numerical simulations. In particular, FIGS. 23, 24, 25, and 26 show the relevant MW field distributions for a case in which a linearly polarized MW plane wave with wavelength in vacuum $\lambda_{mw}$=1.5 mm (corresponding to a MW frequency of 200 GHz) propagates perpendicular to the probe head. In this calculation, the diameter of the wires (1) is 100 μm, the separation between consecutive wires is 500 μm (0.5 mm), the distance of the wires (1) from the mirror (2) is 500 μm, and the polarization of the incoming MW beam is orthogonal to the wires (1). Moreover, a dielectric plate of 300 μm in thickness, assumed made of quartz, has been inserted between the wires (1) and the mirror (2), in contact with the wires, which may be used to store the sample. In the investigated case, the sample is 100 μm thick and placed in contact with the planar conducting mirror (2). Similar results are obtained rescaling all dimensions and the MW wavelength by the same factor.

Figure 24B:
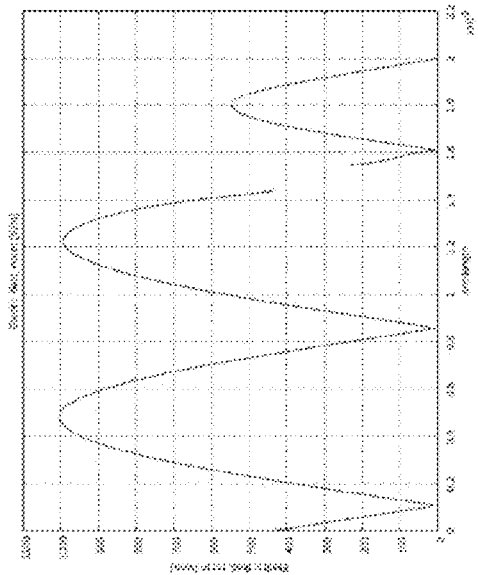
FIG. 24 is a double diagram showing the $E_{mw}$ field distribution same along two axial directions, one including a grid element and one not.
Figure 26:
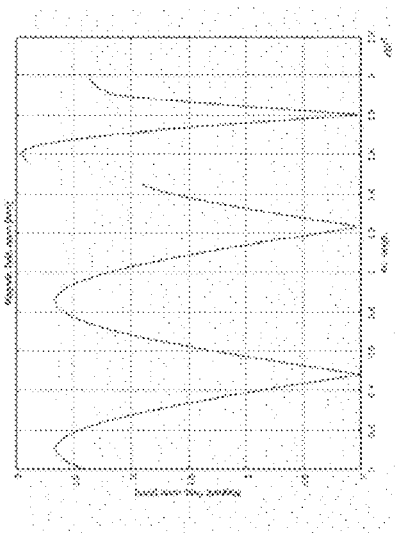
FIG. 26 is a diagram showing the $B_{mw}$ field distribution along the second axial direction of FIG. 24.
Figure 24A:
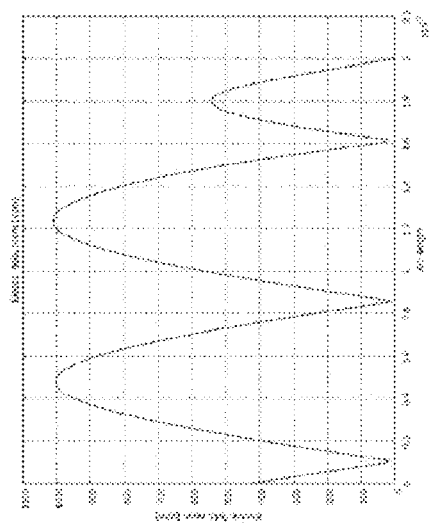
Figure 25:
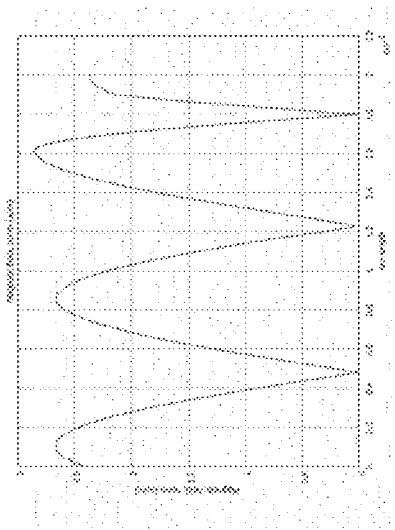
FIG. 25 is a diagram showing the $B_{mw}$ field distribution along the first axial direction of FIG. 24.

The reduction in the amplitude of the $E_{mw}$ field inside the probe with respect to the field outside, evidenced by FIG. 24, is due to the presence of the above mentioned dielectric plate and to a weak partial reflection of the MW beam on the grid polarizer (1). On the other hand, the effect on the amplitude of $B_{mw}$ inside the probe is less pronounced, as shown by FIG. 25 and FIG. 26. The presence of the wires generates a localized perturbation of the electric field $E_{mw}$ and of the magnetic field $B_{mw}$. In particular, the variation of $E_{mw}$ and $B_{mw}$ along a transversal horizontal line corresponding to the upper surface of the sample, 100 µm away from the mirror is of the order of 1% of its amplitude or less.

The insertion of a dielectric plate can allow a relevant gain in terms of $B_{mw}/E_{mw}$, on the sample, as can be inferred comparing FIG. 24 with FIG. 25 and FIG. 26, which refer to the case of a quartz plate.

Figure 27:
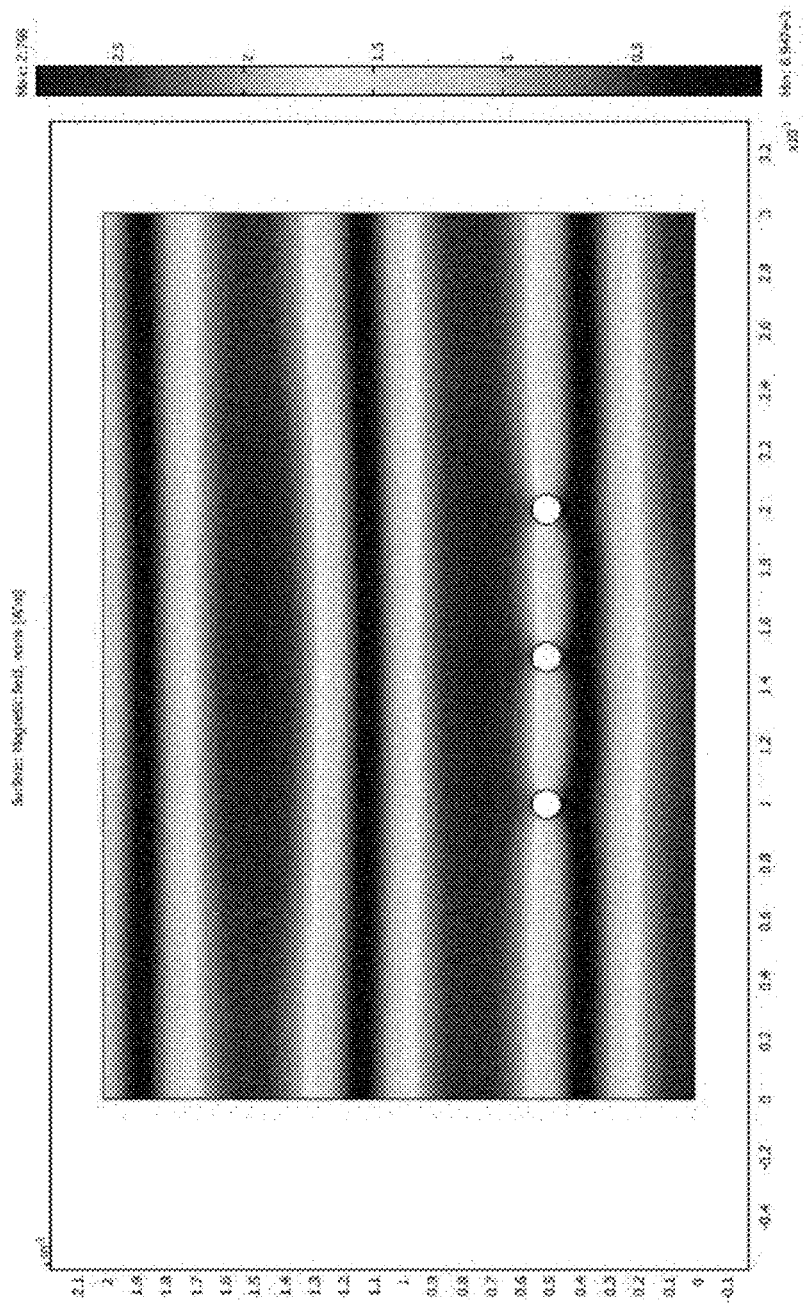
FIG. 27 is a diagram showing in colors the norm of the $B_{mw}$ field distribution in the probe head of FIG. 1A, in a case of finite lateral extension of the grid polarizer and no dielectric plate, irradiated by a microwave plane wave propagating perpendicular to the probe head and having polarization orthogonal to the elements of the grid, according to finite-element simulations.

In the diagram of FIG. 27 a numerical modelling of the $B_{mw}$ distribution is shown, for a plane wave propagating perpendicular to the probe head and having linear polarization orthogonal to the grid elements, in a case of finite lateral extension of the grid polarizer. The size of the different elements is the same as in the case of FIG. 23. In this case, however, the dielectric plate is not present.

Figure 28:
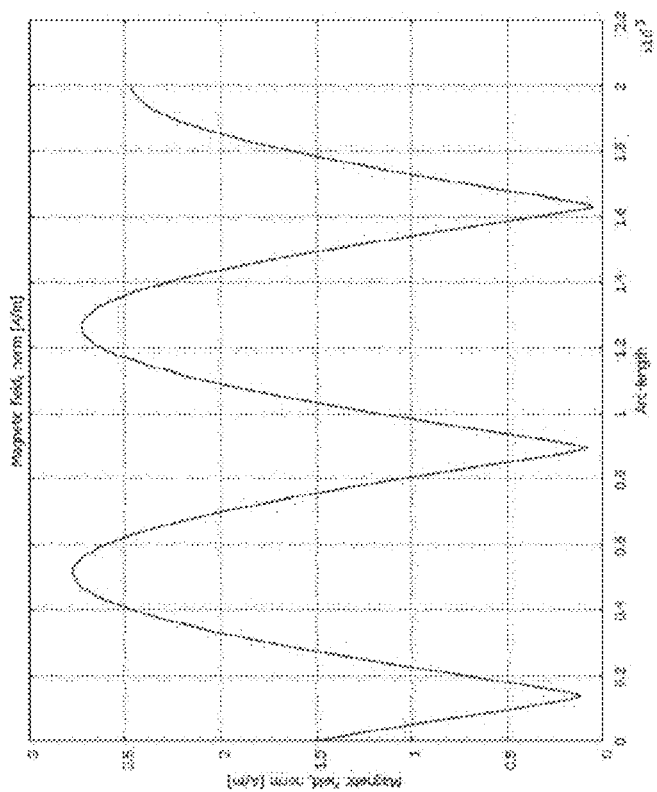
FIG. 28 is a diagram showing the spatial behavior of $B_{mw}$ in a direction perpendicular to the probe, in a region between two grid elements of the case of FIG. 27, which highlights the limited effects of the grid on the amplitude of the wave.

The spatial behaviour of $B_{mw}$ in a direction perpendicular to the probe, in the region of the grid elements, is shown in FIG. 28, wherein the limited effects of the grid on the amplitude of the wave becomes apparent.

Figure 29:
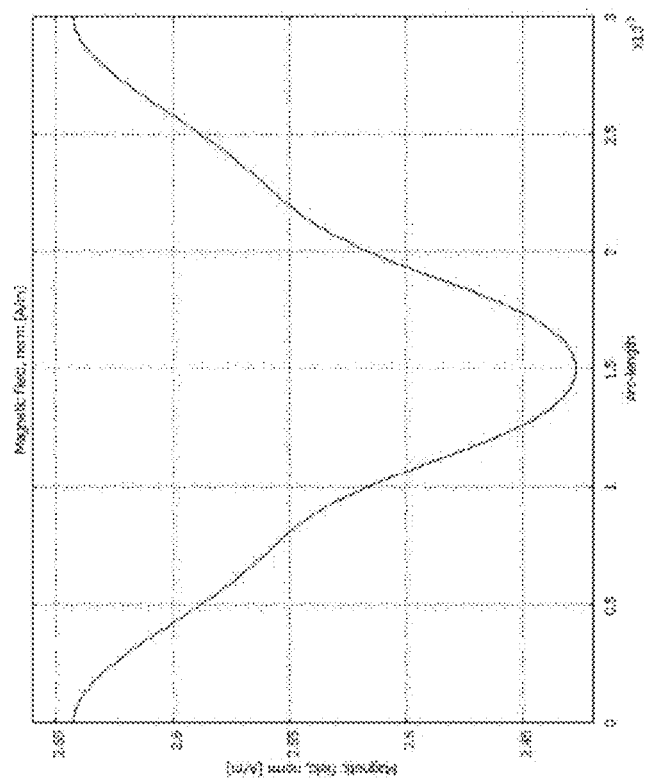
FIG. 29 is a diagram showing the spatial behavior of $B_{mw}$ along the surface of the planar mirror in the case of FIG. 27, which highlights the relatively high spatial uniformity of the $B_{mw}$ field in the region below the grid elements.

Again, the spatial behaviour of $B_{mw}$ along the surface of the planar mirror is shown in FIG. 29, which evidences the relatively high spatial uniformity of the field, whose variation is limited to few percents in the region below the grid elements.

With reference to FIG. 2A, the probe head of FIGS. 1A to 1C is shown with a sample (8) in a dielectric region (7) partially illuminated by the MW beam (3) and enclosed between the grid polarizer (1) and the mirror surface (2). The role of the dielectric region (7) is manifold: it can serve as sample holder, to improve the mechanical rigidity of the structure, to hold the grid elements, to increase the ratio $B_{mw}/E_{mw}$ in the sample region, to minimize the reflected wave in the propagation of the MW beam from the space outside the probe head to the sample region, to improve the thermal diffusion capability of the probe head.

The sample (8) is distributed in a planar shape, i.e. preferably in a substantially slice arrangement, on the conducting element (2) of the probe head, where the electric field $E_{mw}$ associated to a linearly polarized, plane wave MW beam propagating orthogonal to the planar probe vanishes. In these ideal conditions, it is noted that, exactly at the mirror surface, said electric field has a virtually null intensity.

However, further accommodations may be foreseen. Possibly, the sample may be neither planar nor placed in contact with the mirror (2). It can have in general arbitrary thickness. It may also be distributed outside the region between the mirror (2) and the grid polarizer (1). The dielectric region (7) may be present or may be not present.

With reference to FIG. 2B, a probe head similar to the previously described one, but having grid elements (1) with the shape of strips having a rectangular cross section, is shown. In the dielectric region (7), one or more microfluidic channels (8) are arranged to allow a fluid to be encased within the probe head and possibly to flow, such a configuration being useful, for instance, in the case of chemically induced DNP.

Generally speaking, the sample can be arranged between the elements composing the probe head or in their close proximity, either alone or in a sample holder, which can also serve as holder for the grid elements (1). A dielectric sample holder can improve the ratio between the MW magnetic field $B_{mw}$ and the MW electric field $E_{mw}$ on the sample.

It is intended that the dielectric region and the sample chamber can have arbitrary shape, size, and position. The dielectric region (7), when present, may surround the conducting grid elements (1) and it may also comprise an anti-reflection coating, or a series of dielectric areas, for instance of pyramidal shape, improving the MW beam (3) impedance matching in the passage between the space external to the RF transducer to the space internal to the RF transducer.

In the following, $B_{rf}$ and $E_{rf}$ designate the magnetic field and the electric field associated to the RF waves, respectively.

When the sample is closely surrounded by the distributed coil RF transducer formed by the conducting element (2) and the grid polarizer (1), the coil can be operated to generate an intense and homogeneous RF magnetic field $B_{rf}$ and a very weak RF electric field $E_{rf}$ on the sample. The coil can also be operated as efficient detector for the RF field generated by the sample, thanks to the high RF magnetic field filling factor which can be obtained in relationship with the sample (8).

The structure of the probe head is almost totally transparent, on the grid polarizer (1) side, to a properly polarized MW radiation (3) incident on the RF transducer. The reflection of this MW radiation on the mirror side (2) of the probe head generates a controlled MW standing wave on the sample (8), which can be placed in a region of intense and uniform MW magnetic field and weak MW electric field, as necessary for an efficient implementation of the magnetic resonance techniques.

The number, the relative position, the shape, and the materials that compose the grid elements forming the grid polarizer (1) part of the RF transducer, can be chosen to obtain the desired uniformity or distribution of the RF magnetic field on the sample (8).

As a result of the versatility in the design of the grid polarizer (1) and of the conducting element (2), this probe head solves the problem of constructing a sensitive and efficient RF transducer for both excitation and detection purposes, which enables a simultaneous, controlled, uniform, and efficient electromagnetic irradiation with MW frequencies of small and large samples, also at very high MW power, as often required in DNP-NMR and DNP-MRI. Moreover, the open structure of the probe head is suited for further electromagnetic irradiations of the sample at frequencies higher than microwaves, necessary for instance in those cases in which the paramagnetic species are photogenerated.

The close contact of the sample (8) with a dielectric structure (7), made for instance by a high thermal conductivity material (sapphire, silicon, quartz, and so on), and possibly with a massive conducting plate (2), can solve the problem of the dielectric heating of the sample, due to the MW electric field and to the RF electric field, and of its temperature stabilization. Moreover, it can allow a fast control and variation of the temperature of the sample.

The possibly large lateral extension of the sample, where in this context lateral means along the planar surfaces of the RF transducer, makes the invented probe head compatible with complex microfluidic structures, allowing a practical implementation of the 'lab-on-a-chip' concept in presence of the DNP effect. Moreover, the proposed probe head is inherently broadband and easily built for MW frequencies well beyond the current needs of DNP-NMR, DNP-MRI, and ENDOR-EPR (about 1000 MHz RF radiation, about 700 GHz MW radiation), exploiting for instance the capabilities of the electronic industry, as photolithographic techniques, as well as more recent techniques as the metal coating by means of electroless plating (ELP) techniques, possibly combined with stereolithography, and so on. The use of these techniques makes possible an extreme miniaturization of the invented probe head.

Another common problem in NMR spectroscopy is the spectral resolution of the measurements, mostly related to the susceptibility broadening of the NMR signal introduced by the probe head. In the proposed probe head, the susceptibility broadening can be mitigated employing samples distributed in thin layers or slices in contact with the planar conducting mirror (2), where the static magnetic field variation is quite limited due to the electromagnetic boundary conditions.

Moreover, the described planar geometry of the invented probe head, together with its possible large lateral size, allows to work with amounts of sample that are still of the order or higher than hundreds of nanoliters, also for very thin layers, which appear enough for many DNP-NMR applications. The weak residual susceptibility broadening expected for these thin layers can be reduced employing susceptibility compensated metal components or a combination of metallic and dielectric materials having similar susceptibilities, as in the case of copper and PTFE (Polytetrafluoroethylene). A further possibility is to use a single material, as semiconducting silicon or a plastic material, for all the parts of the probe head, and to obtain the necessary conducting channels through a variable doping or a metal coating.

The samples that can be characterized by the present probe head may be solid, liquid, or gaseous samples, including the extremely important family of the high dielectric loss samples typical of biological systems in their natural conditions. Moreover, the invention is particularly suited for geometries which are usually complex to be investigated, e.g. thin films and surfaces.

In addition to the main configurations shown in FIGS. 1A to 2B, it is possible to use the probe head with the MW electric field polarized parallel to the grid elements (1). In this case, the efficiency of the MW irradiation of the sample is lower, but other orientations of the static magnetic field $B_0$ with respect to the probe head can be profitably employed. In the case in which $E_{mw}$ is parallel to the grid elements, the penetration of the MW radiation in the internal space of the RF transducer, as well as its uniformity, can be improved setting the distance d between adjacent grid elements, otherwise arbitrary, higher than $\lambda_{mw}/2$, where $\lambda_{mw}$ is the MW wavelength in vacuum. This condition can be relaxed surrounding the conducting grid elements with a dielectric material with dielectric constant $\in$ at MW, being now the condition to satisfy $d > \lambda_{mw}/2\sqrt{\in}$.

In the above mentioned case, the grid polarizer (1) does not properly behave as a polarizer; indeed, its polarization discrimination is strongly attenuated. However, the probe head still shows some of the advantages of the initially proposed configuration. In any case, a limited polarization discrimination can be a specific advantage in the case of a circularly polarized MW irradiation of the probe head.

The proposed probe head introduces specific elements of flexibility that can solve some problems encountered in the most advanced NMR probe heads, either conceived for standard applications or for DNP applications. One of these problems is given by the limited homogeneity of the RF magnetic field in the sample region, which can be due to a non-optimal RF current distribution or to edge effects, as in the case of the flat microcoils and of the solenoids described in the prior art.

With reference to FIGS. 3A to 3B and 4A to 4B, another embodiment is shown wherein the relative amplitude of the radiofrequency currents in the different grid elements (1) is defined by changing the length of each of said elements, thus varying the electrical resistance of the related current paths. In this manner, the spatial distribution of the RF current in the RF transducer can be adjusted to obtain a specific spatial distribution of the RF magnetic field, either homogeneous or tailored according to a specific application.

Figure 3A:
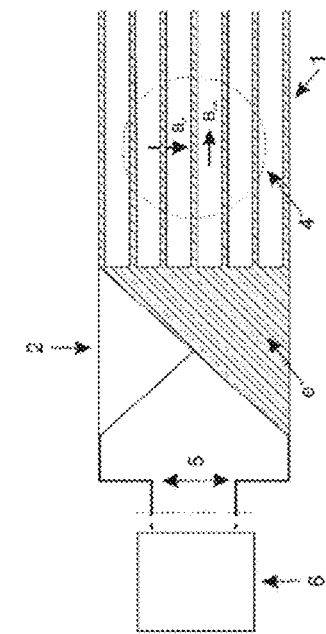
FIG. 3A is a top view of a probe head according to a second embodiment thereof, wherein the length of the grid elements is variable.
Figure 3B:
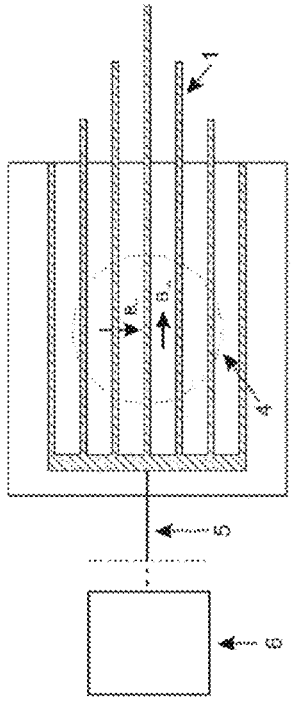
FIG. 3B is a side view of the probe head of FIG. 3A.

In the embodiment illustrated by FIGS. 3A and 3B, the length of each grid element (1) is varied on the side electrically connected to the conducting element (2), in this case with longer grid elements (1) at the centre of the grid polarizer and grid elements becoming shorter as they are placed far and far away from the centre, as shown in FIG. 3A.

Figure 4A:
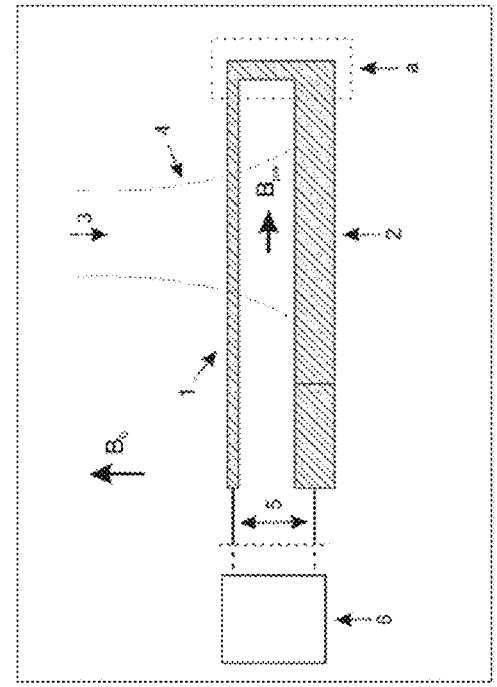
FIG. 4A is a top view of a probe head according to a third embodiment thereof, wherein the total length of the grid elements is changed by changing the shape of the electric contact on the RF circuit side, this shape being possibly arbitrary and adjusted according to the application requirements.
Figure 4B:
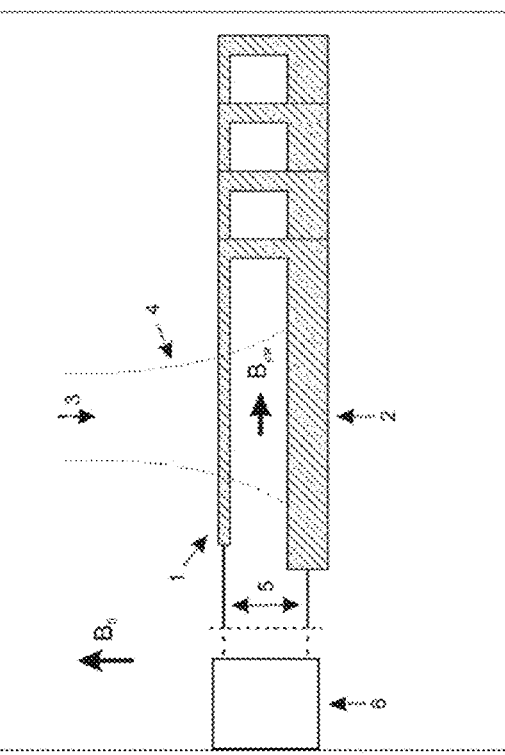
FIG. 4B is a side view of the probe head of FIG. 4A, wherein the conducting parts inside the dashed rectangular regions can be replaced by generic electric contacts.

In the embodiment of FIGS. 4A and 4B, the control on the spatial distribution of the RF currents in the RF transducer is obtained by changing the shape of the interconnecting element (e) of the grid elements (1), in this illustrative case wider at one side and narrower at the other side, which corresponds to approximately equal electrical resistance for the RF currents flowing in various grid elements (1). This approach can also be applied to the conducting element (2), for instance shaping in a proper way the side of the conducting element (2) in contact with the RF circuit (6). Said shapes can be designed according to the needed RF current distribution.

It is understood that the same effect of control on the spatial distribution of the RF currents in the RF transducer may be achieved changing the local mutual distance between the grid elements (1), their shape, their size, their material, as well as the shape of the conducting element (2) (FIG. 4A), in addition to the length of the grid elements (1).

In FIGS. 5A to 5D, it is shown a further embodiment wherein the radiofrequency currents in the probe head follow almost closed paths, in order to increase the RF magnetic field in the space between the grid polarizer (1) and the conducting element (2), as well as to simplify the connection of the RF transducer to the external RF circuits. Moreover, a lateral conducting plate (f) placed at the end of the grid elements (1) can be used as plate of a RF condenser, the other plate of said condenser being represented by a side of the conducting element (2), the resulting condenser schematically corresponding to the shaded region (9), said region being possibly filled with a dielectric material. Hence, the probe head can act as a RF resonant circuit, including the inductance of the distributed coil, the capacity of the condenser (9), and the resistance of the various elements of the RF transducer. The construction of a RF resonant circuit allows to increase, for a given RF power, the RF currents in said circuit, with a corresponding increase in the RF magnetic field generated by the RF transducer, which translates in a higher sensitivity in magnetic resonance applications. At the grid polarizer ends, the conducting parts (10) connecting the grid elements (1) and the conducting element (2), on one side, and the grid elements (1) and the RF circuit (6), on the other side (FIG. 5A), can be replaced by generic electric contacts.

With reference to FIG. 5A, the substantially U-shaped geometry described in connection with FIG. 1B is replaced by a substantially C-shaped geometry.

The almost closed paths of the RF currents flowing in the embodiment of RF transducer illustrated in FIG. 5A increase the amplitude of the RF magnetic field inside said transducer for a given total RF current, which results in improved sensitivity for the device, both in excitation and detection of the magnetic resonance signal. Moreover, this design allows a more compact implementation of the probe head, also suited for the use in the solenoid superconducting magnets (12) employed in modern NMR, as illustrated in FIG. 5D. In the configuration of FIG. 5, the RF transducer is connected to the RF circuit (6) along the axis of the magnet (12), exploiting the side of the RF transducer opposite to the possible incoming MW radiation (3), as illustrated in FIG. 5B. The MW beam can be, possibly guided by an appropriate MW waveguide (11) placed above the probe head.

The capacity of the condenser (9) can be adjusted varying appropriately the shape of the grid elements (1), the surface of their final region (f), the possible dielectric material that fills it, and the distance between the plates of the condenser (9).

With reference to FIG. 5C, a possible arrangement for the spectroscopy of a fluid flowing in a channel (8) is shown, the channel (8) having inlet and outlet ports passing through the conducting element (2) thickness.

In this arrangement the sample can be injected and removed from the probe head through said ports in the backside of the conducting element (2) (FIG. 5C). If the cross section of the ports is rectangular and the long side thereof is aligned to the RF currents flowing in the RF transducer, a very limited effect is expected on the RF magnetic field inside the RF transducer, whose homogeneity can remain very high. Moreover, a weak penetration of the RF magnetic field is expected in said ports, due to the shielding effects of the conducting material in which the ports are drilled. In this way, the sample is excited by the RF magnetic field basically only in the interior of the RF transducer, with the result that long nutation pulses and thus sophisticated two-dimensional (2D) pulse sequences are made possible.

Figure 5F:
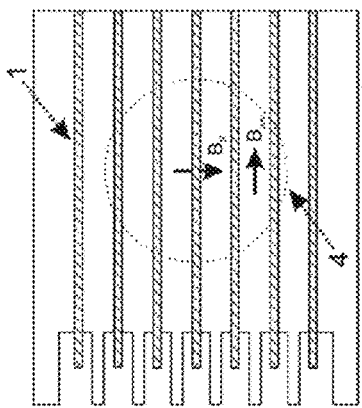
FIG. 5F is a top view of the probe head of FIG. 5E.
Figure 5E:
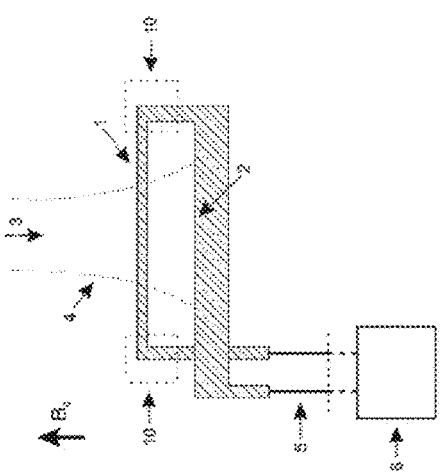
FIG. 5E is a side view of a modification of the probe head of FIG. 5A, wherein the RF currents follow almost closed paths, maximizing the RF efficiency of the device, wherein the conducting parts inside the dashed rectangular regions can be replaced by generic electric contacts.
Figure 23:
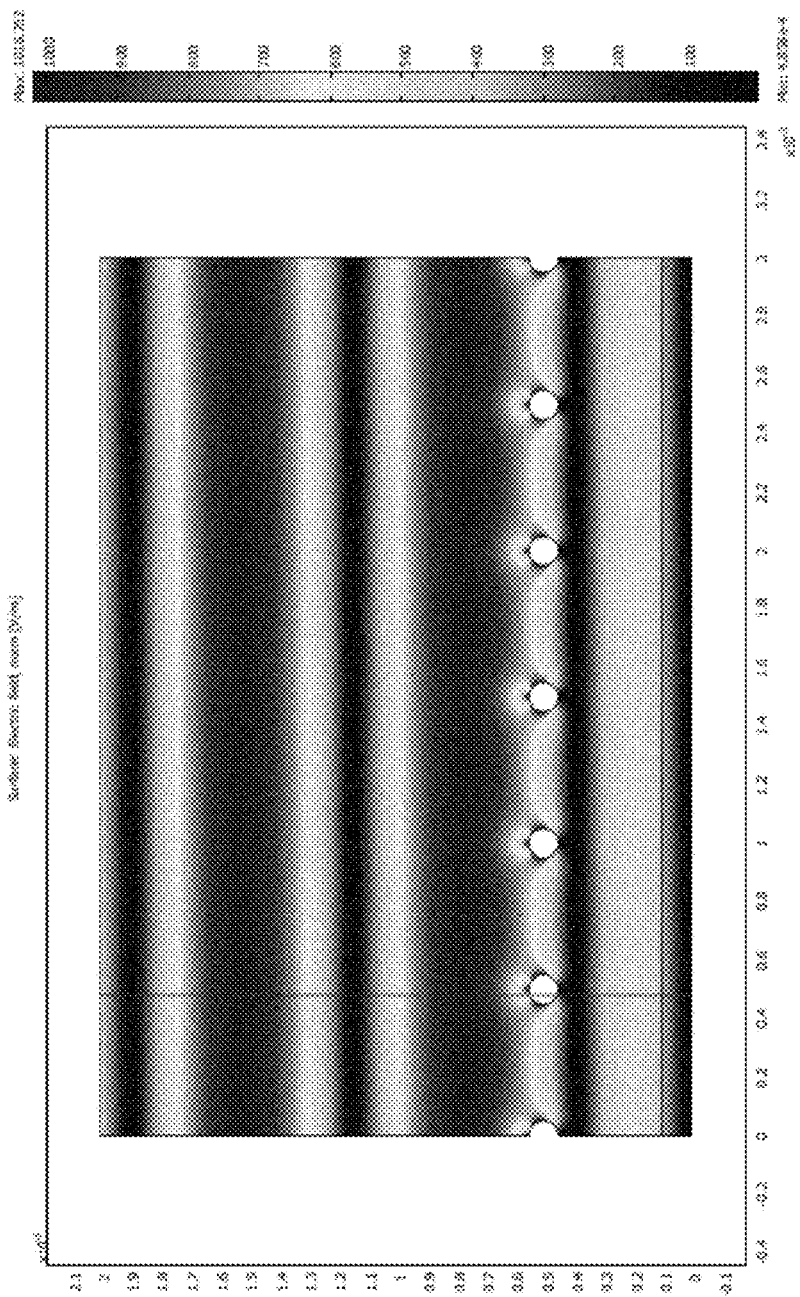
FIG. 23 is a diagram showing in colors the norm of the $E_{mw}$ field distribution in the probe head of FIG. 1A, including a dielectric plate made of quartz, irradiated by a microwave plane wave propagating perpendicular to the probe head and having polarization orthogonal to the elements of the grid, according to finite-element simulations.

In connection with FIGS. 5E and 5F, a modification of the previous embodiment allows again almost closed paths for the RF currents in the RF transducer, according to a different design, with the aim to maximize the RF efficiency of the probe head.

Figure 6:
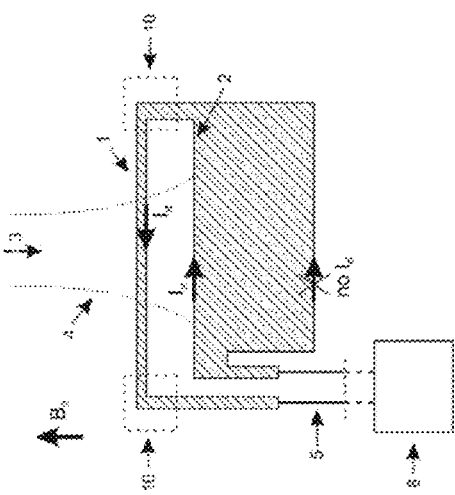
FIG. 6 is a side view of a probe head according to a fifth embodiment thereof, wherein the conducting parts inside the dashed rectangular regions can be replaced by generic electric contacts.

Another variant leading to a higher RF efficiency of the probe head in both excitation and detection of the magnetic resonance signals is shown in FIG. 6. In a large bulk conductor of regular shape, having size much larger than the skin depth of the RF electrical currents, said currents tend to flow in proximity of the surface and to distribute regularly on it. However, in the proposed invention the RF magnetic field $B_{rf}$ that is most useful for the excitation and detection of the magnetic resonance signal is that generated inside the RF transducer, namely in the preferred sample region. For a given total RF current, it is thus useful to increase the RF magnetic field inside the RF transducer (not shown in FIG. 6), reducing the field outside. This effect can be obtained shaping the conducting element (2) in order to increase the electrical resistance of the RF current paths external to the RF transducer, depressing in this way the corresponding RF currents. Correspondingly, the RF currents flowing internally to the RF transducer are increased, as schematically shown in FIG. 6.

The structure of the probe heads discussed so far is basically planar. However, in some applications other shapes are more useful, for instance when the phase front of the MW radiation (3) around the probe head is not planar. In this case, some or all the shapes and the orientation of the components of the probe head, i.e. the conducting element (2), the grid polarizer (1), the sample holder (7) and so on, can be varied to substantially conform and superpose to the phase front geometry of the MW radiation (3), which can be convex, concave, saddle-shaped etc.

Analogously, in those cases wherein the sample and/or the sample holder must have a specific, non-planar shape, as in the case of the so-called Magic Angle Spinning (MAS) technique employed in NMR spectroscopy, where the geometry is preferably cylindrical, the elements of the probe head can be designed accordingly, provided that the conducting element (2) ensures the reflection of the MW radiation (3), the grid polarizer (1) is partially transparent to it, and the combination of said elements (1) and (2) enables the construction of an efficient RF transducer.

With reference to FIGS. 7A and 7B, the peculiar structure of the probe head, with its high degree of flexibility, enables the design of novel measurement methodologies, not allowed by the prior art probe heads in presence of a simultaneous and controlled MW excitation, or not allowed at all. First, it can be noticed that not all the grid elements (1) forming the grid polarizer are needed from the RF excitation and detection of the magnetic resonance signal point of view. It is in general convenient to use only the grid elements over the sample, or the minimum number of them necessary for the requested RF field uniformity in the sample region, in order to maximize the RF magnetic field filling factor, as shown in FIG. 7A. The remaining grid elements can be disconnected from the RF circuit, being only necessary to obtain the requested polarizing behavior with respect to the MW radiation (3), together with the needed MW field uniformity on the sample. The connection of a limited number of grid elements (1) to the RF circuit (6) can allow a selective RF excitation and detection of the magnetic resonance signals in the different regions of the sample.

The grid elements (1) can be divided in several families connected to different RF channels, as illustrated in FIG. 7B. These channels can be used independently, from the RF point of view, to implement a multiple RF excitation, an excitation and detection with a configuration that can be varied in space and time, by using an appropriate sequence of RF excitation pulses for the different families of grid elements, which can be activated possibly simultaneously, as well as a detection in which the various RF circuits are accepting the magnetic resonance signals with a proper sequence of RF circuit activations. Analogously, a separated excitation and detection of the grid element families can be implemented, which appear promising, for instance, in the case of microfluidics, where the reaction can be followed in space (for instance by NMR, DNP-NMR, DNP-MRI, and ENDOR-EPR scanning) and time.

The use of these different RF excitation/detection channels at possible different RF frequencies can be used to implement various NMR channels in the probe, allowing for simultaneous experiments on different nuclei. For instance, this feature allows polarization transfer sequences between nuclei, such as INEPT or spin locking, but also achieves the possible implementation of an NMR Lock channel for optimal spectral resolution.

The concept of NMR, DNP-NMR, DNP-MRI, or ENDOR-EPR spatially selective scanning of the sample, possibly combined with a multi-frequency excitation, is illustrated in FIG. 7B, where groups of grid elements (1) are connected to different RF circuits (6).

The separate RF excitation of close grid elements (1) can allow, using RF currents of appropriate sign and amplitude in the different grid elements, a compensation or a local cancellation of $B_{rf}$, which can result in a more spatially localized RF excitation and thus response, useful for a local magnetic resonance scanning of the sample with higher spatial resolution.

Finally, in connection to FIG. 8, the conducting element (2) employed in the probe head is not necessarily uniform. In some applications, it is convenient to use a suitably corrugated shape for the conducting element surface exposed to the MW beam (3), whose profile can be square, triangular, rectangular, sinusoidal, and so on. Said surface can thus act as a polarization-sensitive element as well. In this manner, it is possible to demonstrate that, in particular conditions, an increase in the MW field amplitude inside the RF transducer can be obtained, in particular when the incoming MW beam passing through the grid polarizer (1) experiences a rotation of its polarization in the reflection on the corrugated surface, since in this case the beam is partially trapped between the grid polarizer (1) and the corrugated surface (2). The multiple reflections between the elements (1) and (2) lead to an increase in the MW field intensity in the space internal to the RF transducer. Analogously, the drilling of micro-holes or micro-slots in the conducting element (2) can increase considerably the local RF magnetic field on the sample. The right side of FIG. 8 shows a case wherein the mirror surface (2) has a rectangular corrugation with a depth q and a pitch 2p.

With reference to FIGS. 9A to 9C, a further embodiment of probe head is shown, based on a microstrip design of the RF transducer, in which the two main elements of the RF transducer, the grid polarizer (1b) and the conducting element (2b), are now coupled by means of RF electric and magnetic fields, as typical for microstrips and striplines, instead of being electrically connected by means of a conducting element (c), as in the case of the RF transducers with distributed coil design discussed so far. The RF transducers based on the microstrip design illustrated in FIGS. 9A to 9C show many of the previously discussed advantages; they allow, moreover, further functionalities.

In particular, the MW grid polarizer can be formed by a series of parallel grid elements (1b). Each grid element (1b), running parallel to the conducting element (2b), acting now as a ground plane for the microstrip, represents a RF propagation system. As in the previous embodiments, the conducting element (2b) acts as a mirror for the incoming MW beam (3).

Basically, all the previous considerations, schemes, and variants apply to the case of the microstrip-based design.

Again, the shape of the MW beam (3) can be arbitrary; grid elements (1b) can have a variable shape, size, length, cross section, local mutual distance, and material/properties, both in transversal and longitudinal direction. The same concept holds for the ground plane (2b) and for the local distance between each grid element (1b) and the ground plane (2b). In analogy to the concepts illustrated by FIGS. 3A to 4B, a progressively increasing size of the grid elements can help to compensate for the RF magnetic field $B_{rf}$ non-homogeneities.

With respect to the RF transducers based on microstrip or stripline design known from the prior art, the embodiments illustrated in FIGS. 9A to 9C are innovative because they have a side substantially transparent to the MW irradiation, which allows a simultaneous, controlled, uniform, and efficient MW irradiation of a sample placed inside the RF transducer, ensuring at the same time an intense and homogeneous RF irradiation of the sample thanks to their basically double-component (the grid polarizer (1b) and the conducting element (2b)) structure, the same arguments employed to demonstrate these properties for the previous embodiments being valid also for the microstrip-based design RF transducers of FIGS. 9A to 9C.

The microstrip-based design RF transducer can have arbitrary size. However, a higher RF sensitivity is expected when it acts as RF resonant element, hence having $\lambda_{rf}/4$, $\lambda_{rf}/2$, or multiple lengths along the direction in which flow the dominant RF currents, provided that the sample to be investigated is placed around a point of maximum $B_{rf}$ and minimum $E_{rf}$. These configurations have the further benefit to reduce the RF dielectric heating of the sample, if said sample is placed in a region of weak $E_{rf}$ field.

With the microstrip-based design, the sample can be subject also to a static or quasi-static electric field, where in this context quasi-static means up to frequencies of the order of MHz. In addition to the study of the effects of such static and quasi-static electric fields on the NMR or EPR spectra, this allows, for instance, a low frequency (up to MHz) dielectric characterization of the sample.

A specific advantage of the microstrip-based design RF transducer is the possibility to improve the capability of the probe head to produce a localized characterization of the sample. This can be obtained by segmenting each grid element (1b) in several sequential pieces, each of them connected to a different RF circuit (6).

This arrangement allows the possibility of a 2D NMR scan of the sample, simultaneous or following a space and time sequence, still in presence of a controlled MW excitation. This scanning can be combined to the field-gradient techniques in MRI. Moreover, the segmentation of the grid elements (1b) is also useful to study an array of samples, namely for fast parallelized screenings, still under a possible MW and higher frequency irradiation of the sample and with high spectral resolution.

A possible drawback of the probe heads based on resonant microstrip or stripline RF transducers is their length, which must be necessarily of the order of $\lambda_{rf}/4$ or $\lambda_{rf}/2$, namely several centimeters, also for magnetic resonance studies at the highest static and pulsed magnetic fields accessible nowadays.

In connection with FIGS. 10A and 10B, two variants of the microstrip-based design RF transducer is hereby described, wherein the lateral size of the probe head is reduced introducing bends at a region (10) at the end(s) of the grid polarizer (1b).

These two variants have a curved ('L-shaped') or folded ('U-shaped') geometry for the microstrip-based probe head, as shown in FIGS. 10A and 10B. In particular, FIG. 10A shows a side view of a variant useful when the RF transducer is designed to operate as a $\lambda_{rf}/4$ RF resonator. In this case, the RF current and the RF magnetic field are at the maximum level in the RF excitation region, namely close to the contact with the RF circuit (6). Only this part of the probe head can be exposed to the MW irradiation (3), as shown in FIG. 10A. Moreover, the size of the part of the probe head accommodating the sample (8) can be chosen according to the extension of the region of maximum homogeneity of the static magnetic field, which is typically between 5 mm and 10 mm in case of NMR.

The parts of the microstrip-based design probe head characterized by weak RF currents, not useful for high sensitivity NMR, can be placed in the curved parts (10) and (13) of the probe head, as illustrated in FIGS. 10A and 10B. Said parts (13) can be designed to work as RF condensers, whose capacity can be adjusted with a proper choice of the dielectric constant of the insulating materials (7) possibly inserted between the strips (1b) and the ground plane (2b) in the regions (13), the thickness of these materials, as well as the shape and the extension of the surface of the strips (1b) and of the conducting element (2b) in the regions (13). In this way, RF condensers are integrated in the probe head, either in the excitation side close to the RF circuit (6) or in the opposite terminal side, which can be used to control the resonance frequency of the RF transducer and its coupling to the external RF circuit (6). Moreover, each of the strips (1b)

can be divided in a series of thin, parallel wires in the region of the probe head subject to the MW beam (3), in order to improve the transparency to the MW radiation (3), keeping the necessary homogeneity of the RF magnetic field.

FIG. 10B shows a side view of a second variant of the microstrip-based design probe head, useful when the RF transducer is designed to operate as a $\lambda_{rf}/2$ RF resonator. In this case, the RF current and the RF magnetic field are at the maximum level at the centre of the probe head. According to the previous considerations, the probe head can be now folded at both ends (10) of the grid polarizer (1b). The two lateral regions (13) can be designed again to act as condensers, possibly with different capacity, according to the experimental needs.

The previously proposed design for the conducting element (2) illustrated in FIG. 6 can also be employed for the conducting elements (2b) of the microstrip-based design probe heads. Analogously, all the other variants previously proposed can be applied to the microstrip-based design probe heads.

In some applications, it is convenient to provide a probe head in principle totally transparent to the MW radiation. This property can be obtained substituting the conducting element (2) or (2b) of all the previous embodiments with a further grid polarizer (1) or (1b), as shown in the illustrative case of FIGS. 11A to 11C.

This further probe head comprises therefore two facing planar grid polarizers (1) made of grid elements which are aligned to each other or mutually displaced, said probe head being irradiated by a MW beam (3) according to a specific profile (4), polarization, and propagation direction. The grids (1) are possibly linked in a substantially U-shaped configuration (FIG. 11B) by means of an arbitrary conducting element (10) to form a distributed coil RF transducer, which is connected to a RF circuit (6) via electric connections (5). The sample (8) can be placed in the internal space of the RF transducer, namely between the two grid polarizers (1), possibly inside a dielectric regions (7). When the phase fronts of the MW beam (3) are substantially planar close to the double-grid RF transducer and aligned to the planar grid polarizers (1), and the polarization of said MW beam (3) is orthogonal to the grid elements (1), thus the double-grid RF transducer can be almost completely transparent to the MW radiation, which is only locally perturbed by the grid polarizers (1), as previously discussed. The RF transducer embodiment of FIGS. 11A to 11C allows a simultaneous, controlled, uniform, and efficient MW irradiation of the sample (8), as for all the previous embodiments.

In this connection, it is noted that all the variants offered for the previous embodiments may be applied to the new design illustrated in FIGS. 11A to 11C, including the 'L-shaped' version, the variable grid element length geometry, etc.

Moreover, a double-grid version of RF transducer may be achieved by a single continuous wire/strip, forming a kind of flat 'solenoid', wherein the wires/strips composing the two large flat sides of said solenoid are arranged parallel to each other, aligned or mutually displaced, in order to act as grid polarizer elements. When the phase fronts of the MW beam (3) are substantially planar close to the flat solenoid RF transducer and aligned to its large flat sides acting as grid polarizers, and the polarization of said MW beam (3) is orthogonal to the grid elements of said grid polarizers, the probe head can be almost completely transparent to the MW radiation, which is only locally perturbed. Again, the flat solenoid RF transducer allows a simultaneous, controlled, uniform, and efficient MW irradiation of the sample.

The double-grid RF transducers considered so far are basically planar. However, in some applications other shapes are more useful, for instance when the phase front of the MW beam (3) around the probe head is not planar. In this case, the shape and orientation of the two grid polarizers can be varied to substantially conform and superpose to the phase front geometry of the MW radiation (3). Analogously, in those cases wherein the sample and/or the sample holder must have a specific, non-planar shape, as in the case of the MAS technique, where the geometry is preferably cylindrical, the grid polarizers composing the double-grid RF transducer can be designed accordingly.

The probe heads here proposed that are based on double-grid RF transducers differ from those know from the prior art, because they allow a simultaneous, controlled, uniform, and efficient MW irradiation of a sample placed inside the RF transducer, in this case thanks to their transparency to the MW radiation, ensuring at the same time an intense and homogeneous RF irradiation of the sample thanks to their basically double-component structure. A key aspect in the design of the invented probe head is the correspondence between the shape of the phase fronts of the MW beam (3) close to the probe head and the shape of the parts of the probe head irradiated by the MW beam. When the RF transducer geometry is substantially planar, the MW beam must be generated with substantially planar and equally oriented phase fronts close to the RF transducer and vice versa; the same must hold for non-planar geometries. In the case of a diverging MW beam with linear polarization, for instance, the two grid polarizers forming the double-grid RF transducers here proposed should have a convex geometry oriented towards the MW beam and grid elements oriented orthogonal to the MW beam polarization.

A missing correspondence between the shape of the phase fronts of the MW beam (3) and the shape of the parts the probe head irradiated by the MW beam (3) generates in general uncontrolled MW field distributions inside the RF transducer, with the results to make largely unpredictable and largely variable the result of the magnetic resonance measurements. This is showed for instance in the papers by Nanni et al. (Journal of Magnetic Resonance vol. 210, 16-23 (2011)) and Wind et al. (Journal of Magnetic Resonance vol. 52, 424-434 (1983)) in which RF transducers in form of solenoids were irradiated by microwaves.

Both the double-grid RF transducer of FIGS. 11A to 11C and said flat 'solenoid' RF transducer can be continuously deformed in a configuration allowing a controlled reflection of the MW beam (3), as shown in FIG. 12. Here, the part of the grid elements on the lower side (2c) of the RF transducer, namely the second side of the RF transducer intercepted by the MW beam according to its direction of propagation, is squeezed to a planar strip shape, until it forms an almost continuous conducting plane. When the distance between two consecutive strips is much smaller than $\lambda_{mw}$, i.e. smaller than $\lambda_{mw}/4$ an almost complete reflection of the MW radiation crossing the first side (upper part) (1) of the RF transducer occurs on said almost continuous conducting plane (2c). A distance of few microns (µm) between consecutive strips is enough to avoid an excessive RF coupling between them, as shown in the literature in connection with microcoils. Moreover, the gaps between the strips could be filled with a low-loss dielectric insulator. From the MW point of view, the embodiment illustrated in FIG. 12 behaves in a similar way to the embodiment illustrated in FIGS. 1A to 1C.

In another embodiment shown in FIG. 13, the double-grid RF transducer, or possibly its flat 'solenoid' version, designed to be substantially transparent to a properly polarized MW beam (3), as discussed above, are combined with a conducting mirror (g) placed below the lower side (2c) of these RF transducers. The shape of the conducting mirror (g) conforms to the MW beam (3) phase front. Said conducting mirror generates a controlled standing wave pattern in the RF transducers. Where necessary, the sample (8) can thus be placed in a region where $E_{mw}$ is weak and $B_{mw}$ is intense, possibly inside dielectric regions (7). The conducting mirror (g) can be a part of other devices, as MW resonators. The embodiment of FIG. 13 allows again a simultaneous, controlled, uniform, and efficient MW irradiation of a sample placed inside the RF transducer, ensuring at the same time an intense and homogeneous RF irradiation of the sample thanks to their double-component structure, as discussed.

The achievement of the maximum allowed signal enhancement in DNP-NMR and DNP-MRI may require a very intense MW irradiation of the sample. This achievement can be obtained either employing an extremely high MW power or inserting the sample inside a MW resonator. An additional problem of the NMR probe heads proposed in the prior art is that they are not compatible with the use inside high performance MW resonators or, when they are, they exhibit a relatively modest RF sensitivity and versatility. On the other hand, the previously described probe heads according to the present invention can overcome these problems, since they can be inserted in MW resonators without compromising neither their RF sensitivity nor the performances of the MW resonator. In case of the planar grid polarizer-conducting mirror RF transducers of FIG. 1A et similar, the probe heads can replace a planar conducting wall of a MW resonator, with the grid polarizer side of the RF transducer inserted inside the MW resonator, without substantial effects in its resonance mode, provided that the polarization of such MW mode is linear and correctly oriented with respect to the grid elements (1), as discussed. In this case, indeed, the grid polarizer is substantially transparent to the MW radiation. A similar result is obtained when said planar grid polarizer-conducting mirror RF transducer is placed in a planar surface of the MW resonator which corresponds to a planar perfect electric conductor (PEC) wall from the electromagnetic fields point of view. Such planar PEC walls are often found in rectangular cross-section MW resonators. Another possibility is to insert the proposed probe heads in Fabry-Perot (FP) MW resonators.

FIGS. 14 and 15 show two illustrative cases in which a RF transducer-based probe head of the type here proposed is inserted in a FP resonator. In particular, FIG. 14 shows a RF transducer comprising a grid polarizer (1) and a conducting mirror (2), similar to that illustrated by FIG. 1A et similar, which replaces the planar mirror of a FP resonator, in this case a semiconfocal one. FIG. 15 shows a RF transducer comprising a double grid polarizer, similar to that illustrated by FIG. 11A et similar, which is inserted inside a FP resonator, in this case a confocal one. The latter configuration highlights the importance of having an almost perfectly MW-transparent probe head, in order to not destroy the resonance mode of the MW resonator.

With reference to FIG. 14, a probe head similar to that illustrated in FIG. 1A replaces the flat mirror of a semiconfocal FP resonator, whose MW resonance frequencies of the modes with polarization orthogonal to the grid elements (1) are mainly defined by the distance between the conducting mirror (2) of the probe and the curved mirror of the FP resonator.

With reference to FIG. 15, a probe head similar to that illustrated in FIG. 11A is placed inside a confocal FP resonator, whose MW resonance frequencies of the modes with polarization orthogonal to the grid elements (1) are mainly defined by the distance between the external curved mirrors of the FP resonator. In this embodiment, the sample can be placed around a surface of vanishing MW electric field and maximum MW magnetic field, exploiting the standing wave nature of the FP resonance modes.

The invented probe heads can be placed in regions of the MW resonator where the phase front of the MW radiation is not planar. In this case, the shape of the parts of the probe head that are subject to the microwaves must substantially conform to that of the MW phase front, as discussed. This basically holds for all the described probe heads. As exemplificative case, it can be considered the configuration of FIG. 14, in which the distance between the grid polarizer (1) and the conducting mirror (2) of the RF transducer is not negligible compared with $\lambda_{mw}$. In this case, a grid polarizer curved according to the phase front of the MW radiation on the surface of said grid polarizer is more convenient for the MW resonances with respect to a planar grid polarizer. This concept will be illustrated by FIG. 16C.

The combination of a high efficiency NMR probe head, as those here proposed, with a high efficiency MW resonator, is particularly suited for ENDOR-EPR applications, since such a combination can solve the problem of the low efficiency and the poor versatility of the probe heads proposed so far in prior art for ENDOR-EPR techniques. Analogously, this combination is useful also for the so-called dissolution DNP techniques, taking into account the large accessibility to the sample region allowed by the proposed probe heads. Moreover, the size scalability of the proposed inventions allows entering in extremely high RF and MW frequency regimes.

The proposed probe heads can act themselves as MW resonator. In particular, the grid polarizer always induces a partial reflection of the incoming MW beam, which can be controlled changing the geometry and the distribution of the conducting grid elements. In the proposed probe heads, the grid polarizer is preferably designed to keep the MW reflection to a substantially negligible level, with the exception of the embodiment illustrated in FIG. 12, in which the lower side (2c) of the RF transducer acts as a high reflectivity mirror for the MW beam (3). Grid polarizers designed to act as high MW reflectivity mirrors can be employed as elements of MW resonators. In this context, such grids with high MW reflectivity can be termed grid mirrors, being this terminology more illustrative of their most relevant MW function. It is worth to note that the MW reflectivity of the grid mirrors depends on the polarization of the MW radiation. Moreover, the use of grid mirrors with curved shape can help to refocus the MW beam, with a possible significant improvement in the performances of the MW resonator. FIGS. 16A to 18 show further embodiments in which the proposed probe heads act also as MW resonator or as a part of MW resonator.

With reference to FIGS. 16A and 16B, a proposed RF transducer acts also as semiconfocal MW resonator, where the grid mirror (1) is formed by curved grid elements arranged according to a dome profile. As common to all the proposed embodiments, the second component of the RF transducer is given by the conducting element (2), acting also as planar mirror for the MW resonator. The grid mirror (1) and the conducting element (2) are electrically connected in an arbitrary way in the region (10). The grid mirror (1) works as MW element having polarization-sensitive reflectivity. Thus, it can act as MW modal filter which discriminates among resonance modes with different polarization. The coupling to the incoming MW beam (3) to the MW resonator based on the proposed probe head can be adjusted changing the shape, size, and local mutual distance between the elements of the grid mirror, as well as the orientation with respect to said MW beam polarization. In this way, it is possible to build a compact, quasi-single mode MW resonator, allowing a controlled, uniform, and efficient MW irradiation of a sample (8) placed inside the device, possibly with dielectric regions, said MW resonator acting at the same time as RF transducer with well controlled and almost closed RF current paths, which ensures an efficient excitation and detection of the magnetic resonance signal of the sample (8).

The embodiment represented by FIGS. 16A and 16B can be part of a larger MW resonator, as shown in FIG. 16C. In this case, the RF transducer can be itself a resonant as well as a non-resonant MW element, depending on the reflectivity of the grid element (1) and on the distance between said grid element (1) and the conducting mirror (2).

In the previous embodiments, the direction of the static magnetic field can be arbitrary.

With reference to FIGS. 17A and 17B, a proposed RF transducer may act also as confocal MW resonator. In this connection, the RF transducer can have two facing grid mirrors (1), both formed by curved grid elements arranged according to respective dome profiles, either similar or different. The elements of the two grid mirrors (1) are electrically connected in an arbitrary way in the region (10), in order to form the typical RF transducer with almost closed and well controlled RF current paths here proposed. Both the grid mirrors exhibit a polarization-sensitive reflectivity. As above, the direction of the static magnetic field can be arbitrary and the sample can be placed elsewhere in the resonator.

With reference to FIG. 19, another embodiment of the probe head according to the invention is arranged to act as MW resonator, wherein the probe head structure is substantially planar and the lateral confinement of the MW radiation stored between the grid mirror (1) and the conducting mirror (2) is mainly obtained by means of a dielectric region (7). The grid mirror (1) and the facing conducting mirror (2) can be either electrically connected, for instance as in the embodiment of FIG. 16B, or RF coupled, for instance as in the embodiment of FIGS. 9A to 9C, in order to act as RF transducer. A front view of the probe head is shown in FIG. 18, with a possible distribution of the sample (8).

As anticipated, in the embodiment illustrated by FIG. 13, the conducting mirror (g) can be part of a MW resonator, following for instance the designs illustrated by the embodiments of FIGS. 14 to 18.

Now, attention is put on the $B_{rf}$ filling factor calculated on the sample volume for the previous configurations of probe head according to the invention. In the cases illustrated so far, in which the sample is preferably distributed inside the RF transducer, at the best only about half of the RF magnetic energy of the probe head can be coupled with the sample, as known from the theory of the RF coils. In order to increase the $B_{rf}$ filling factor and thus the measurement sensitivity in magnetic resonance applications, it is necessary to exploit the RF magnetic energy outside the RF transducer, or to change design.

With reference to FIGS. 19A and 19B, a further embodiment of probe head is shown, wherein a further grid polarizer (1d) is added to the RF transducer, facing the common elements of the proposed probe head, namely the grid polarizer (1) and the conducting element (2), which can be itself another grid polarizer, as discussed above. The basic concept behind this embodiment is that the RF magnetic field outside the part of the RF transducer given by the grid polarizer (1) and the conducting element (2), namely outside the space between the elements (1) and (2), can be mostly focused in the space between the grid polarizer (1) and the additional grid polarizer (1d). Such a configuration can be obtained, for instance, electrically connecting the elements (1), (2), and (1d) among them and to the RF circuit (6) as shown in FIG. 19A, which reports a side view of the probe head. In particular, the total RF current in the probe head can enter the RF transducer through the central element (1) and leave it through the side components (1d) and (2). In this manner, the RF magnetic field lines are forced around the central element (1), as illustrated also in FIG. 19B. The sample (8) can be profitably inserted between the elements (1) and (2) and between the elements (1) and (1d). The related $B_{rf}$ filling factor can ideally increase towards unity (100% of the RF magnetic energy coupled to the sample), neglecting the fraction of magnetic energy around the edges of the RF transducer elements. This configuration remembers a typical stripline configuration, in which a central conductor is inserted between ground planes. The main inventive contribution in the stripline-like designs illustrated in FIGS. 19A to 20 is that some components of the RF transducer can be substantially transparent to a MW beam (3) with appropriate polarization, thus allowing a controlled, uniform, and efficient MW irradiation of a sample (8) placed inside the device, said RF transducer allowing at the same time well controlled and almost closed RF current paths which surround the sample (8), which lead to intense and homogeneous $B_{rf}$ fields on the sample, translating as discussed above in an efficient excitation and detection of the magnetic resonance signal.

In this connection, the grid elements of the grid polarizers (1) and (1d) can be parallel to each other and superposed or mutually displaced. The electrical connection (10) between the central grid polarizer (1) and the external RF elements, namely the second grid polarizer (1d) and the conducting element (2), can be symmetric, as shown in FIG. 19A. This electrical connection can be arbitrary built, for instance by massive conductors, by metal coating of a substantially insulating material, or by electric wires. It can also be asymmetric, with the electrical resistance and length of the electrical connection between the central grid polarizer (1) and the external grid polarizer (1d) differing from the electrical resistance and length of the electrical connection between the central grid polarizer (1) and the conducting element (2). The latter option allows controlling the distribution, the phase, and the amplitude of the RF currents in the external RF elements (1d) and (2), which in turn allows a fine control over the spatial distribution and time behavior of the field $B_{rf}$. In another embodiment, the central grid polarizer (1) can be not electrically connected at all to one or both the external RF elements (1d) and (2); instead, it can be coupled to one or both of them by means of the RF electric and magnetic fields, in analogy to the microstrip-based design illustrated in FIGS. 9A to 9C. In general, each grid element of the two grid polarizers (1) and (1d) can be electrically connected or RF coupled in an arbitrary way to any other grid element or to the conducting element (2). In analogy to the previous embodiments, the conducting element (2) can act as mirror for the MW beam (3).

In a further embodiment, a stripline-like probe head almost completely transparent to the MW radiation can be obtained replacing the lower conducting element (2) of FIGS. 19A to 20 with a further grid polarizer, superposed or mutually displaced with respect to the other two grid polarizers, in analogy to the approach of FIG. 11. In all these cases, non-planar geometries can be implemented as well, provided that these geometries conform to the phase fronts of the MW beam (3) close to the parts of the probe head subject to said MW beam.

In all these cases, the central grid polarizer (1) can extend over distances different from those of the external elements (1d) and (2), as illustrated by FIGS. 19B and 21. Analogously, the number and distribution of the grid elements in each grid polarizer forming the stripline-like RF transducer can be different from the other grid polarizers. Moreover, the number of grid elements of each grid polarizer that can be connected to other elements of the RF transducer can be arbitrary, as in the cases illustrated by FIGS. 7A, 7B, and 11C. The cross section, shape, size, local mutual distance, and material/properties of said grid elements can be arbitrary, as well as the direction of the $B_0$ field with respect to the probe head. All the technical solutions described by the previous embodiments, for instance the non-planar geometries of the various FIGS. 5, 10, 16, can be applied to the stripline-like design probe heads of FIGS. 19 and 20.

In order to maximize the spatial confinement of the $B_{rf}$ field, limiting the straight field at the edges of the probe, appropriate conducting elements (s) can be inserted in the structures illustrated by the embodiments of FIGS. 19A to 20 and in the related discussions, as shown in FIGS. 21A and 21B. In this further embodiment the $B_{rf}$ flux is forced to accumulate in the regions between the central grid polarizer and the external RF transducer elements, owing to the conducting elements (s) which act as shields for the RF magnetic field. The shape of these shields can be arbitrary, according to their specific application. Their impact on the spectral resolution of the measurements can be limited employing susceptibility-compensated materials.

In a further embodiment of the proposed probe head, the RF transducer design illustrated by FIGS. 1A to 1D can be combined with the microstrip design illustrated by FIGS. 9A to 9C. In particular, some of the grid elements forming the grid polarizer (1) can be electrically connected to the conducting element (2), so acting as a distributed coil, whereas other elements of the grid polarizer (1) can be RF coupled to the conducting element (2), so acting as microstrips. All these elements can be fed by means of a single RF circuit (6) or by means of different RF circuits (6).

All the above described probe heads preferentially operate with a MW beam having linear polarization orthogonal to the direction of the grid elements (1) although, as previously discussed, other polarizations are allowed, in particular when the distance d between said grid elements satisfies the condition $d > \lambda_{mw}/2$.

A system to obtain an isotropic response of the probe head to the polarization of a MW beam propagating almost perpendicularly to it is to provide a further configuration with two distinct and crossed grid polarizers (1b), either electrically connected or RF coupled to the conducting element (2b), this latter being possibly replaced by another pair of grid polarizers, according to the embodiment of FIG. 11A. An isotropic MW response allows, in particular, the MW irradiation of the sample with circularly polarized waves. The grid elements of the two crossed polarizers can be interlaced to each other. A fully periodic structure of the crossed grid elements can be designed to obtain a constructive MW interference among the partial waves crossing said two grid polarizers.

With reference to FIG. 22, this further embodiment has been provided also to meet the requirement of generating and detecting circularly polarized RF radiation, in addition to the requirement of isotropic MW response. The use of circularly polarized electromagnetic waves allows higher excitation efficiencies and detection sensitivities, in comparison to the use of probe heads allowing only linearly polarized radiation. However, the penetration of the MW radiation through the crossed grid polarizers configuration of FIG. 22 is lower than that achievable with a single grid polarizer or with parallel grid polarizers.

It is understood that the RF elements composing the RF transducer of FIG. 22 are preferentially fed by RF signals with a ±90° phase difference, by means of different RF circuits (6), as schematically indicated in FIG. 22.

It is further noted that all the technical solutions illustrated by the previous embodiments can be applied to the isotropic response probe head of FIG. 22. In particular, the segmentation of the elements of the grid polarizers can allow an accurate 2D spectroscopic scan of the sample, which can be combined to the field-gradient techniques in Magnetic Resonance Imaging (MRI).

In general, all the elements of flexibility introduced in the description of the different embodiments (variable length, shape, size, mutual distance, position, direction, material, frequency, phase, and so on) apply in general to all the probe heads that can be designed according to the proposed inventive concepts.

A further common property of all the discussed probe heads, with the exception of the resonant ones described by the FIGS. 16A, 16B, 17A, 17B, 18, is their MW response weakly dependent on the frequency and thus broadband, which makes the described structures compatible with experiments requiring extremely short (thus spectrally spread) pulses of MW irradiation.

The construction of the discussed probe heads requires common materials and well-established techniques, as those usually employed in precision mechanical working (computer numerical control lathe and cutter, electric discharge machining) and in electronic industry (photolithography, chemical etching, wire bonding, doping control), although more sophisticated techniques, as electroless plating (ELP) techniques, possibly combined with stereolithography, can be usefully employed.

In conclusion, in the framework of all the magnetic resonance techniques, with any of the above described probe heads a sample can be irradiated with frequencies typical of nuclear Zeeman transitions (NMR transitions/RF excitation) and, simultaneously or in situ, with frequencies typical of electron Zeeman transitions (EPR transitions/MW excitation). Through said probe heads an efficient RF irradiation of the sample with well controlled, intense and homogeneous $B_{rf}$ field distribution can be achieved, as well as a high RF filling factor. Moreover, they allow a simultaneous, intense, controlled, and uniform MW irradiation of the sample, also with high MW power, as well as high spatial separation between $E_{mw}$ and $B_{mw}$. Other benefits exhibited by the proposed probe heads are the high heat dissipation capabilities, the possibility of a precise temperature control and variation, the high static magnetic field uniformity over the sample, the scalability to extremely high fields/frequencies (at least 36 T/1000 GHz).

Therefore, the main advantages of the above probe heads can be resumed as follows: efficiency in terms of RF sensitivity and RF field control and flexibility of use with the most advanced NMR techniques proposed so far; compatibility with complex microfluidic structures and with large planar samples; ample adaptability to complex setup configurations; capability to combine RF efficiency, in both excitation and detection, with a simultaneous, controlled, uniform, and efficient MW irradiation of the sample, also at very high MW powers; possibility to simultaneously implement various NMR channels at different frequencies for simultaneous measurements on different nuclei, opening the way to polarization transfer sequences between nuclei such as INEPT of spin locking, also in presence of Dynamic Nuclear Polarization enhancement; possibility to perform DNP-NMR, DNP-MRI, and ENDOR-EPR of systems with stable as well as chemically induced or photo-generated paramagnetic species; possibility to perform DNP enhanced MRI imaging on planar samples, slices, or surfaces; possibility to perform dissolution DNP; and structure open to additional electromagnetic irradiations of the sample at higher frequencies, as THz, FIR, IR, visible, UV, and beyond.

Finally, the above described probe heads may also be used in fields of application different from the magnetic resonances. Among them, it can be mentioned: the characterization of the magnetic permeability, also in the case of thin film samples; the optical microscopy measurements, possibly combined with RF excitation or full NMR/MRI and DNP-NMR/MRI; the frequency measurement of the RF beat signal generated by the superposition of different MW, THz, FIR, IR, visible, or UV electromagnetic waves in nonlinear mediums; the excitation, the detection, and the analysis of atoms, ions, or plasma, trapped or condensed on a chip, for instance by means of RF and visible radiation, for frequency standards, satellite clocks, quantum information processing, atom interferometry, and other applications, in particular related to Bose-Einstein Condensates and magneto-optical traps.

To the above described hyperpolarization and multiple irradiation probe heads a man skilled in the art, in order to meet specific requirements and contingencies, may bring further modifications, all falling within the scope of protection of the present invention, as defined by the annexed claims.

The invention claimed is:

1. A magnetic resonance hyperpolarization and multiple irradiation probe head, apt to accommodate a sample therein to have it irradiated by a predetermined microwave (MW) beam having a given phase front and wavelength in vacuum $\lambda_{mw}$, the probe including a radiofrequency (RF) transducer for generating and detecting a RF signal, wherein said RF transducer comprises:
an electrically conducting element;
a grid polarizer embodied by at least one grid made of conducting grid elements which are spaced to each other so as the grid is at least partially transparent to said MW beam, said grid being at least partially electrically connected or RF coupled to the conducting element,
wherein the grid polarizer and the electrically conducting element of the RF transducer are shaped and oriented to conform to said MW beam phase front, said grid polarizer and said electrically conducting element being placed so as to define a space enclosed therebetween to receive said sample.

2. Probe head according to claim 1, wherein said electrically conducting element is a planar conducting plate of arbitrary thickness, which has a reflecting surface for said MW beam, said reflecting surface facing said grid polarizer.

3. Probe head according to claim 2, wherein the reflecting surface of the electrically conducting element of the RF transducer is a corrugated surface so as to act as polarization-sensitive element for the MW radiation.

4. Probe head according to claim 1, wherein said grid elements comprise wires, strips, rods or bar-like elements, preferably having cross-section size smaller than $\lambda_{mw}$, where $\lambda_{mw}$ is the MW wavelength in vacuum.

5. Probe head according to claim 4, wherein said electrically conducting element is a planar conducting plate of arbitrary thickness, which has a reflecting surface for said MW beam, said reflecting surface facing said grid polarizer, and wherein said at least one grid polarizer is composed by parallel and mutually spaced wires or strips, arranged according to a predetermined direction on a planar surface, with mutual relative distance preferably smaller than $\lambda_{mw}/2$, where $\lambda_{mw}$ is the MW wavelength in vacuum.

6. Probe head according to claim 5, wherein said grid polarizer is arranged parallel to said electrically conducting element.

7. Probe head according to claim 6, wherein each grid element and the conducting element are electrically connected to obtain a substantially U-shaped distributed coil RF transducer having two parallel sides, apt to surround a sample placed therein.

8. Probe head according to claim 1, wherein one or more microfluidic channels are arranged to allow a fluid to be encased between said electrically conducting element and said grid polarizer and possibly to flow.

9. Probe head according to claim 1, wherein said space enclosed within said RF transducer includes a dielectric region, possibly surrounding the grid elements, comprising an anti-reflection coating or a series of dielectric areas to minimize the reflection of the incoming MW radiation.

10. Probe head according to claim 1, wherein selected series of electrically conducting grid elements are electrically connected or RF coupled to a single RF circuit or to independent RF circuits.

11. Probe head according to claim 1, wherein the grid polarizer is made of a series of strip elements, each strip element facing the conducting element, the grid polarizer and the conducting element being coupled by means of RF electric and magnetic fields, said strip elements and said electrically conducting element acting as a microstrip-like RF transducer.

12. Probe head according to claim 11, wherein each strip is segmented in several sequential pieces, each of them acting, together with the facing conducting element, as a microstrip-like RF transducer, said RF transducers being connected to different RF circuits of the probe head.

13. Probe head according to claim 1, wherein the RF transducer is composed by two facing planar grid polarizers electrically connected or RF coupled to each other, with substantially parallel grid elements, one of them operating as electrically conducting element.

14. Probe head according to claim 13, wherein said two facing grid polarizers composing the RF transducer are electrically connected to each other to achieve a single solenoid, wherein the grid elements composing the two grid polarizers are arranged substantially parallel to each other.

15. Probe head according to claim 13, wherein one of said grid polarizers of the RF transducer is composed by adjacent conducting strips with mutual distance smaller than $\lambda_{mw}$, in order to behave as a highly reflecting surface for the MW beam.

16. Probe head according to claim 13, wherein one of said two facing grids composing the RF transducer is placed substantially parallel to a reflecting surface for the MW beam.

17. Probe head according to claim 1, comprising a MW resonator.

18. Probe head according to claim 1, comprising a further grid polarizer between the grid polarizer and the conducting element, said further grid polarizer being electrically connected or RF coupled to the grid polarizer and to the electrically conducting element.

19. Probe head according to claim 1, wherein the shape of said grid elements is such that they act as a plate of a condenser, the other plate of said condenser being represented by a side of the conducting element, possibly including between said grid elements and said conducting element a dielectric region.

20. Use of a probe head as defined in claim 1, wherein a sample placed therein is irradiated by MW and/or higher frequency electromagnetic waves, and the probe head acts as RF signal transducer.

21. Use of a probe head according to claim 20, wherein said higher frequency electromagnetic waves belong to the ultraviolet region of the electromagnetic spectrum.

* * * * *